(12) United States Patent
Xu et al.

(10) Patent No.: US 10,720,931 B2
(45) Date of Patent: *Jul. 21, 2020

(54) WIDEBAND POLAR RECEIVER ARCHITECTURE AND SIGNAL PROCESSING METHODS

(71) Applicant: Innophase, Inc., San Diego, CA (US)

(72) Inventors: Yang Xu, San Diego, CA (US); Sara Munoz Hermoso, San Diego, CA (US); Roc Berenguer Perez, San Sebastian (ES)

(73) Assignee: INNOPHASE INC., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/384,770

(22) Filed: Apr. 15, 2019

(65) Prior Publication Data

US 2019/0238146 A1  Aug. 1, 2019

Related U.S. Application Data

(63) Continuation of application No. 15/614,560, filed on Jun. 5, 2017, now Pat. No. 10,320,403, which is a
(Continued)

(51) Int. Cl.
*H03L 7/24* (2006.01)
*H03D 3/00* (2006.01)
(Continued)

(52) U.S. Cl.
CPC .............. *H03L 7/24* (2013.01); *H03D 3/007* (2013.01); *H04L 27/389* (2013.01); *H03D 2200/006* (2013.01)

(58) Field of Classification Search
CPC ... H04L 27/2276; H04L 5/06; H04L 27/2275; H04J 1/20
See application file for complete search history.

(56) References Cited

U.S. PATENT DOCUMENTS 4,271,412 A  6/1981  Glass
4,322,819 A  3/1982  Hyatt
(Continued)

FOREIGN PATENT DOCUMENTS

EP  1187313  3/2002
JP  07221570  8/1995
(Continued)

OTHER PUBLICATIONS

He, Xin and Kuhn, William B. "A Fully Integrated Q-enhanced LC Filter with 6dB Noise Figure at 2.5 GHz in SOI" 2004 IEEE Radio Frequency Integrated Circuits Symposium, pp. 643-646 (4 pages).
(Continued)

*Primary Examiner* — Lee Nguyen
(74) *Attorney, Agent, or Firm* — Invention Mine LLC

(57) ABSTRACT

Wideband polar receivers and method of operation are described. A phase-modulated input signal is received at a polar receiver that includes an injection-locked oscillator. The injection-locked oscillator includes a plurality of injection points. Based on the frequency of the input signal, a particular Nth harmonic is selected, and the input signal is injected at the set of injection points corresponding to the selected Nth harmonic. The injection-locked oscillator generates an oscillator output signal, and the phase of the input signal is determined from the phase of the oscillator output signal. In some embodiments, the oscillator output signal is frequency-multiplied by N, mixed with the input signal, and filtered for use in amplitude detection. The input signal is decoded based on the phase and amplitude information.

16 Claims, 11 Drawing Sheets

Related U.S. Application Data continuation-in-part of application No. 14/957,134, filed on Dec. 2, 2015, now Pat. No. 9,673,829, and a continuation-in-part of application No. 14/957,131, filed on Dec. 2, 2015, now Pat. No. 9,673,828.

(51) Int. Cl.
*H04L 27/38* (2006.01)
*H04B 3/46* (2015.01)

(56) References Cited

U.S. PATENT DOCUMENTS

| | | | |
|---|---|---|---|
| 5,325,095 | A | 6/1994 | Vadnais |
| 5,493,581 | A | 2/1996 | Young |
| 5,635,864 | A | 6/1997 | Jones |
| 6,161,420 | A | 12/2000 | Dilger |
| 6,369,659 | B1 | 4/2002 | Delzer |
| 6,373,337 | B1 | 4/2002 | Ganser |
| 6,556,636 | B1 | 4/2003 | Takagi |
| 6,587,187 | B2 | 7/2003 | Watanabe |
| 6,975,165 | B2 | 12/2005 | LopezVillegas |
| 7,042,958 | B2 | 5/2006 | Biedka |
| 7,095,274 | B2 | 8/2006 | LopezVillegas |
| 7,193,462 | B2 | 3/2007 | Braithwaite |
| 7,332,973 | B2 | 2/2008 | Lee |
| 7,400,203 | B2 | 7/2008 | Ojo |
| 7,447,272 | B2 | 11/2008 | Haglan |
| 7,564,929 | B2 | 7/2009 | LopezVillegas |
| 7,602,244 | B1 | 10/2009 | Holmes |
| 7,773,713 | B2 | 8/2010 | Cafaro |
| 7,888,973 | B1 | 2/2011 | Rezzi |
| 8,314,653 | B1 | 11/2012 | Granger-Jones |
| 8,368,477 | B2 | 2/2013 | Moon |
| 8,421,661 | B1 | 4/2013 | Jee |
| 8,498,601 | B2 | 7/2013 | Horng |
| 8,666,325 | B2 | 3/2014 | Shute |
| 8,804,875 | B1 | 8/2014 | Xu |
| 8,854,091 | B2 | 10/2014 | Hossain |
| 8,929,486 | B2 | 1/2015 | Xu et al. |
| 8,941,441 | B2 | 1/2015 | Testi |
| 9,083,588 | B1 | 7/2015 | Xu |
| 9,178,691 | B2 | 11/2015 | Shimizu |
| 9,240,914 | B2 | 1/2016 | Yao |
| 9,497,055 | B2 | 11/2016 | Xu |
| 9,519,035 | B2 | 12/2016 | Ramirez |
| 9,673,828 | B1 | 6/2017 | Xu |
| 9,673,829 | B1 | 6/2017 | Xu |
| 9,813,011 | B2 | 11/2017 | Despesse |
| 9,813,033 | B2 | 11/2017 | Testi et al. |
| 9,819,524 | B2 | 11/2017 | Khoury et al. |
| 9,985,638 | B2 | 5/2018 | Xu et al. |
| 10,122,397 | B2 | 11/2018 | Xu et al. |
| 10,148,230 | B2 | 12/2018 | Xu et al. |
| 10,158,509 | B2 | 12/2018 | Xu et al. |
| 10,320,403 | B2 * | 6/2019 | Xu .................. H03L 7/24 |
| 2001/0001616 | A1 | 5/2001 | Rakib |
| 2002/0048326 | A1 | 4/2002 | Sahlman |
| 2002/0132597 | A1 | 9/2002 | Peterzell |
| 2003/0053554 | A1 | 3/2003 | McCrokle |
| 2003/0058036 | A1 | 3/2003 | Stillman et al. |
| 2003/0174783 | A1 | 9/2003 | Rahman et al. |
| 2004/0036538 | A1 | 2/2004 | Devries |
| 2004/0100330 | A1 | 5/2004 | Chandler |
| 2004/0146118 | A1 | 7/2004 | Talwalkar et al. |
| 2005/0285541 | A1 | 12/2005 | LeChevalier |
| 2006/0145762 | A1 | 7/2006 | Leete |
| 2006/0193401 | A1 | 8/2006 | Lopez Villegas |
| 2006/0285541 | A1 | 12/2006 | Roy |
| 2007/0132511 | A1 | 6/2007 | Ryynanen |
| 2008/0079497 | A1 | 4/2008 | Fang |
| 2008/0112526 | A1 | 5/2008 | Yi |
| 2008/0150645 | A1 | 6/2008 | McCorquodale |
| 2008/0192872 | A1 | 8/2008 | Lindoff |
| 2008/0192877 | A1 | 8/2008 | Eliezer |
| 2008/0205709 | A1 | 8/2008 | Masuda |
| 2008/0211576 | A1 | 9/2008 | Moffatt |
| 2008/0220735 | A1 | 9/2008 | Kim |
| 2008/0225981 | A1 | 9/2008 | Reddy |
| 2008/0225984 | A1 | 9/2008 | Ahmed |
| 2008/0291064 | A1 | 11/2008 | Johansson |
| 2009/0153244 | A1 | 6/2009 | Cabanillas |
| 2010/0303047 | A1 | 12/2010 | Ibrahim et al. |
| 2011/0003571 | A1 | 1/2011 | Park |
| 2011/0019657 | A1 | 1/2011 | Zaher |
| 2011/0050296 | A1 | 3/2011 | Fagg |
| 2011/0159877 | A1 | 6/2011 | Kenington |
| 2011/0260790 | A1 | 10/2011 | Haddad |
| 2011/0298557 | A1 | 12/2011 | Kobayashi |
| 2011/0299632 | A1 | 12/2011 | Mirzaei |
| 2011/0300885 | A1 | 12/2011 | Darabi |
| 2012/0074990 | A1 | 3/2012 | Sornin |
| 2012/0256693 | A1 | 10/2012 | Raghunathan |
| 2012/0306547 | A1 | 12/2012 | Arora |
| 2013/0143509 | A1 | 6/2013 | Horng |
| 2013/0257494 | A1 | 10/2013 | Nikaeen |
| 2014/0023163 | A1 | 1/2014 | Xu |
| 2014/0133528 | A1 | 5/2014 | Noest |
| 2014/0185723 | A1 | 7/2014 | Belitzer |
| 2014/0266480 | A1 | 9/2014 | Li et al. |
| 2014/0269999 | A1 | 9/2014 | Cui |
| 2014/0321479 | A1 | 10/2014 | Zhang et al. |
| 2015/0180685 | A1 | 6/2015 | Noest |
| 2015/0207499 | A1 | 7/2015 | Horng |
| 2016/0155558 | A1 | 6/2016 | Groves |
| 2016/0169717 | A1 | 6/2016 | Zhitomirsky |
| 2017/0085405 | A1 | 3/2017 | Xu |
| 2017/0163272 | A1 | 6/2017 | Xu |
| 2017/0187364 | A1 | 6/2017 | Park et al. |
| 2017/0194973 | A1 | 7/2017 | Moehlmann |
| 2018/0196972 | A1 | 7/2018 | Lu et al. |
| 2019/0059055 | A1 | 2/2019 | Murali |

FOREIGN PATENT DOCUMENTS

| | | |
|---|---|---|
| JP | 11088064 | 3/1999 |
| WO | 2005078921 A2 | 8/2005 |
| WO | 2005078921 A3 | 4/2006 |
| WO | 2012132847 | 4/2012 |

OTHER PUBLICATIONS

International Search Report and Written Opinion for PCT/US2014/026459 dated Jul. 28, 2014 (10 pages).

International Search Report and Written Opinion for PCT/US2014/030525 dated Jul. 24, 2014. (16 pages).

Chi-Tsan Chen et al., Wireless Polar Receiver Using Two Injection-Locked Oscillator Stages for Green Radios, IEEE MTT-S International, Jun. 2011. (4 pages).

International Search Report for PCT/US2013/024159 dated Apr. 9, 2013 (1 page).

Rategh, H.R. & Lee, T.H.. (1998), "Superharmonic injection locked oscillators as low power frequency dividers", 132-135. 10.1109/VLSIC.1998.688031. (4 pages).

Jose Maria Lopez-Villegas et al., BPSK to ASK Signal Conversion Using Injection-Locked Oscillators—Part I: Theory, Dec. 2005, IEEE Transactions on Microwave Theory and Techniques, vol. 53, No. 12, pp. 3757-3766 (10 pages).

Behzad Razavi, "A Study of Injection Pulling and Locking in Oscillators", Electrical Engineering Department, University of California, 2003, IEEE, Custom Integrated Circuits Conference. pp. 305-312 (8 pages).

N. Siripon, et al., Novel Sub-Harmonic Injection-Locked Balanced Oscillator, Microwave and Systems Research Group (MSRG), School of Electronics, Computing and Mathematics, University of Surrey, Sep. 24, 2011, 31st European Microwave Conference. (4 pages).

Marc Tiebout, "A 50GHz Direct Injection Locked Oscillator Topology as Low Power Frequency Divider in 0.13 μm CMOS", Infineon Technologies AG, Solid-State Circuits Conference, 2003, pp. 73-76, 29th European ESSCIRC. (4 pages).

(56) References Cited

OTHER PUBLICATIONS

Henzler, S., "Time-to_Digital Converters", Springer Series in Advanced Microelectronics 29, DOI, 10.1007/978-90-481-8628-0_2, copyright Springer Science+Business Media B.V. 2010, Chapter 2, pp. 5-19 (15 pages).

Pei-Kang Tsai, et al., "Wideband Injection-Locked Divide-by-3 Frequency Divider Design with Regenerative Second-Harmonic Feedback Technique", RF@CAD Laboratory, Department of Electrical Engineering, National Cheng Kung University, Tainan, Taiwan. Mar. 21, 2013 (4 pages).

Nazari, et al., "Polar Quantizer for Wireless Receivers: Theory, Analysis, and CMOS Implementation", IEEE Transactions on Cricuits and Systems, vol. 61, No. 3, Mar. 2014. pp. 1-81 (94 pages).

Lin, et al., "Single-Stage Vernier Time-to-Digital Converter with Sub-Gate Delay Time Resolution", Circuits and Systems, 2011, 2, 365-371, Oct. 2011. pp. 365-371 (7 pages).

Jovanovic, et al., "Vernier's Delay Line Time-to-Digital Converter", Scientific Publications of the State University of Novi Pazar, Ser. A: Appl. Math. Inform. and Mech., vol. 1, 1 (2009), pp. 11-20. (10 pages).

Effendrik, P., "Time-to-Digital Converter (TDC) for WiMAX ADPLL in State-of-The-Art 40-nm CMOS", MSc Thesis, Apr. 18, 2011 (80 pages).

Dudek, et al., "A High-Resolution CMOS Time-to-Digital Converter Utilizing a Vernier Delay Line", IEEE Transactions on Solid-State Circuits, vol. 35, No. 2, Feb. 2000. pp. 240-247 (8 pages).

Jose Maria Lopez-Villegas et al., BPSK to ASK Signal Conversion Using Injection-Locked Oscillators—Part I: Theory, Dec. 2005, IEEE Transactions on Microwave Theory and Techniques, vol. 53, No. 12, available online at: http://diposit.ub.edu/dspace/bitstream/2445/8751/1/529612.pdf (10 pages).

Hamid R. Rategh, et al., Superharmonic Injection Locked Oscillators as Low Power Frequency Dividers, Stanford University, Stanford, California, IEEE Jun. 13, 1998 (4 pages).

Pei-Kang Tsai, et al., Wideband Injection-Locked Divide-by-3 Frequency Divider Design with Regenerative Second-Harmonic Feedback Technique, RF@CAD Laboratory, Department of Electrical Engineering, National Cheng Kung University, Tainan, Taiwan 2009. (4 pages).

Marc Tiebout, A 50GHz Direct Injection Locked Oscillator Topology as Low Power Frequency Divider in 0.13 µ m CMOS, Infineon Technologies AG, Solid-State Circuits Conference, 2003, pp. 73-76, (4 pages), 29th European ESSCIRC.

Hewlett Packard, Phase Noise Characterization of Microwave Oscillators, Frequency Discriminator Method, Sep. 1985, USA (45 pages).

Paul O'Brien, et al.; Analog Devices Raheen Business Park Limerick Ireland paul-p . . . "A Comparison of Two Delay Line Discriminator Implementations for Low Cost Phase Noise Measurement." (2010). pp. 1-11 (11 pages).

International Search Report and Written Opinion for PCT/US2014/029055 dated Sep. 15, 2014 (12 pages).

Aeroflex, Application Note, Measurement of Frequency Stability and Phase Noise, Feb. 2007, part No. 46891/865 (8 pages).

Electronic Warfare and Radar Systems Engineering Handbook, Mixers and Frequency Discriminators, Section 6-8.1 to 6-8.2, Apr. 1, 1999, Naval Air Systems Command and Naval Air Warfare Center, USA (299 pages).

Notification of Transmittal of the International Search Report and The Written Opinion of the International Searching Authority, or The Declaration, for PCT/US16/53484, dated Dec. 19, 2016, 8 pages.

Claude Frantz, Frequency Discriminator, published 1994, pp. 1-7 (7 pages).

Chi-Tsan Chen, Cognitive Polar Receiver Using Two Injection-Locked Oscillator Stages, IEEE Transactions on Microwave Theory and Techniques, vol. 59, No. 12, Dec. 2011, pp. 3483-3493 (10 pages).

Jianjun Yu and Fa Foster Dai, "A 3-Dimensional Vernier Ring Time-to-digital Converter in 0.13µm CMOS", Electrical and Computer Engineering, Auburn University, Auburn, AL 36849, USA, Sep. 19, 2010 (4 pages).

Putnam, William, and Julius Smith, "Design of fractional delay filters using convex optimization" (1997 IEEE ASSP Workshop on Applications of Signal Processing to Audio and Acoustics). (4 pages).

Notification of Transmittal of The International Search Report and The Written Opinion of the International Search Authority, or the Declaration, for PCT/US16/64772 dated Feb. 28, 2017 (7 pages).

Dongyi Liao, et al., "An 802.11a/b/g/n. Digital Fractional-N PLL With Automatic TDC Linearity Calibration for Spur Cancellation", IEEE Journal of Solid-State Circuits, 0018-9200 © 2017 IEEE.; Jan. 16, 2017 (11 pages).

Antonio Liscidini, Luca Vercesi, and Rinaldo Castello, "Time to Digital Converter based on a 2-dimensions Vernier architecture", University of Pavia Via Ferrata 1, 27100 Pavia, Italy; Sep. 13, 2009 (4 pages).

Renaldi Winoto, et al. "A 2×2 WLAN and Bluetooth Combo SoC in 28nm CMOS with On-Chip WLAN Digital Power Amplifier, Integrated 2G/BT SP3T Switch and BT Pulling Cancelation", ISSCC 2016 / Session 9 / High-Performance Wireless / 9.4, 2016 IEEE International Solid-State Circuits Conference; Feb. 2, 2016, pp. 170-172 (3 pages).

Ahmad Mirzaei, et al, Multi-Phase Injection Widens Lock Range of Ring-Oscillator-Based Frequency Dividers, IEEE Journal of Solid-State Circuits, vol. 43, No. 3, Mar. 2008, pp. 656-671 (16 pages).

William Putnam , Julius Smith, "Design of Fractional Delay Filters Using Convex Optimization", Department of Electrical Engineering and, Center for Research in Music and Acoustics (CCRMA), Stanford University, Stanford, CA 94305-8180; Oct. 1997 (4 pages).

Jun-Chau Chien, et al, Analysis and Design of Wideband Injection-Locked Ring Oscillators With Multiple-Input Injection, EEE Journal of Solid-State Circuits, vol. 42, No. 9, Sep. 2007, pp. 1906-1915 (10 pages).

William Putnam, Julius Smith, "Design of Fractional Delay Filters Using Convex Optimization", Department of Electrical Engineering and Center for Research in Music and Acoustics (CCRMA) Stanford University Stanford, CA 94305-8180. Published in IEEE: workshop on applications of signal processing to audio and acoustics; Oct. 1997 (4 pages).

Stefano Pellerano, at al. "A 4.75-GHz Fractional Frequency Divider-by-1.25 With TDC-Based All-Digital Spur Calibration in 45-nm CMOS", 3422 IEEE Journal of Solid-State Circuits, vol. 44, No. 12, Dec. 2009, pp. 3422-3433 (12 pages).

Notification Concerning Transmittal of International Preliminary Report on Patentability and the Written Opinion of the International Searching Authority, for PCT/US16/64772 dated Jun. 14, 2018, Written Opinion dated Feb. 28, 2017, (6 pages).

Notification of Transmittal of the International Search Report and the Written Opinion of the International Searching Authority, or the declaration for PCT/US2013/024159 dated Apr. 9, 2013 (8 pages).

International Search report and Written Opinion for PCT/US18/27222 dated Jun. 28, 2018 (6 pages).

Darvishi, Milad & Van der Zee, Ronan & Klumperink, Eric & Nauta, Bram. (2012). "A 0.3-to-1.2GHz tunable 4th-order switched gmC bandpass filter with >55dB ultimate rejection and out-of-band IIP3 of +29dBm". American Journal of Physics—Amer J Phys. 55. pp. 358-360 (3 pages) 10.1109/ISSCC.2012.6177050.

Robert F. Wiser, Masoud Zargari, David K. Su, Bruce A. Wooley, "A 5-GHz Wireless LAN Transmitter with Integrated Tunable High-Q RF Filter", Solid-State Circuits IEEE Journal of, vol. 44, No. 8, pp. 2114-2125 (12 pages), 2009.

Rafael Betancourt-Zamora, et al; "1-GHz and 2.8-GHz CMOS injection-locked ring oscillator prescalers"; Allen Center for Integrated Systems, Stanford University; Conference Paper • Feb. 2001, (5 pages).

Cheng, Jiao et al. 9.6 "A 1.3mW 0.6V WBAN-compatible sub-sampling PSK receiver in 65nm CMOS." 2014 IEEE International Solid-State Circuits Conference Digest of Technical Papers (ISSCC) (2014): pp. 168-169 (3 pages).

(56) References Cited

OTHER PUBLICATIONS

He, Xin & B. Kuhn, William. (2005). A2.5-GHz low-power, high dynamic range, self-tuned Q-enhanced LC filter in SOI. Solid-State Circuits, IEEE Journal of. 40. 1618-1628 (11 pages) 10.1109/JSSC.2005.852043.

Li, Dandan and Tsividis, Yannis; "Design techniques for automatically tuned integrated gigahertz-range active LC filters", IEEE Journal of Solid-State Circuits, vol. 37, No. 8, pp. 967-977 (11 pages), Aug. 2002.

Testi, Nicolo et al. "A 2.4GHz 72dB-variable-gain 100dB-DR 7.8mW 4th-order tunable Q-enhanced LC band-pass filter." 2015 IEEE Radio Frequency Integrated Circuits Symposium (RFIC) (2015): 87-90 (4 pages).

Ross, Andrew; "Power Save Issues in WLAN"; Silex Technology America, Inc.; 2014; (35 pages).

International Preliminary Report on Patentability for PCT/US2016/064772, dated Jun. 14, 2018, 1-6 (6 pages).

\* cited by examiner

WIDEBAND POLAR RECEIVER ARCHITECTURE AND SIGNAL PROCESSING METHODS

CROSS-REFERENCE TO RELATED APPLICATIONS

This application is a continuation of U.S. application Ser. No. 15/614,560, filed Jun. 5, 2017, entitled "WIDEBAND POLAR RECEIVER ARCHITECTURE AND SIGNAL PROCESSING METHODS," which is a continuation-in-part of U.S. application Ser. No. 14/957,134, filed Dec. 2, 2015, entitled "WIDEBAND POLAR RECEIVER ARCHITECTURE AND SIGNAL PROCESSING METHODS," now U.S. Pat. No. 9,673,829, issued on Jun. 6, 2017, and is a continuation-in-part of U.S. application Ser. No. 14/957,131, filed Dec. 2, 2015, entitled "WIDEBAND POLAR RECEIVER ARCHITECTURE AND SIGNAL PROCESSING METHODS," now U.S. Pat. No. 9,673,828, issued on Jun. 6, 2017, each of which is hereby incorporated by reference in its entirety.

BACKGROUND

Communications transceivers may utilize numerous architectures to recover data from a modulated carrier signal. These architectures include coherent demodulation, using either intermediate frequency conversion or direct-conversion receivers. Such receivers typically recover or regenerate the communications carrier signal using a phase-locked loop (PLL) and coherent demodulation. Recently, polar receiver architectures have been proposed that extract the modulation phase components from a received modulation signal without using a carrier recovery circuitry. However, the proposed polar receiver architectures and associated signal processing have deficiencies that result in poor performance and high bit error rates (BER). Accordingly, there is a need for improved polar receiver signal processing and architectures.

SUMMARY

In an exemplary method, a phase-modulated input signal is received at a polar receiver including an injection locked oscillator. The injection-locked oscillator includes at least a first set of injection points and a second set of injection points, each set of injection points corresponding to a different harmonic of the injection-locked oscillator. In some embodiments, the injection-locked oscillator is a ring oscillator including a plurality of sequential buffers, and wherein each of the injection points is at a respective buffer. Based on a frequency of the input signal, one of the sets of injection points is selected. The injection-locked oscillator is operated to generate an oscillator output signal while the input signal is injected at the selected set of injection points. A phase of the oscillator output signal is measured to determine the phase of the modulated input signal.

In some embodiments, selection of one of the sets of injection points is performed by selecting, based on the frequency of the input signal, an Nth harmonic of the injection-locked oscillator such that the frequency of the input signal divided by N is within a locking range of the injection-locked oscillator. A set of injection points associated with the Nth harmonic of the injection-locked oscillator is then used for injection of the input signal. The injection-locked oscillator may be tuned such that a free-running frequency of the injection-locked oscillator is substantially the frequency of the input signal divided by N.

In some embodiments, a plurality of band-specific amplifiers are provided, and the input signal is amplified with a selected one of the band-specific amplifiers prior to injection the input signal. The selection of the amplifier may be based on the frequency of the input signal.

An exemplary polar receiver includes an injection-locked oscillator with at least a first set of injection points and a second set of injection points, where each set of injection points corresponds to a different harmonic of the injection-locked oscillator. The injection-locked oscillator has at least one oscillator output. Injection selection circuitry is provided, the injection selection circuitry being operative to selectively provide the input signal to a selected one of the sets of injection points. Phase detection circuitry is further connected to the oscillator output. The phase detection circuitry may include a frequency divider having an input connected to the oscillator output and a time-to-digital converter connected to the output of the frequency divider.

In another exemplary method, a phase-modulated input signal is received at a polar receiver including an injection-locked oscillator. The injection-locked oscillator is operated to generate an oscillator output signal while the input signal is injected into the injection-locked oscillator at a set of injection points corresponding to an Nth harmonic of the injection-locked oscillator, where N is an integer. A frequency of the oscillator output signal is multiplied by a factor of N to generate a frequency-multiplied oscillator signal. The frequency-multiplied oscillator signal is mixed with the input signal to generate a mixed signal. The mixed signal is filtered, and the filtered mixed signal is sampled. In some embodiments, the integer N is greater than one. The method may include selecting the value N such that the frequency of the phase-modulated signal is substantially an Nth harmonic of a frequency within a locking range of the injection-locked oscillator. In some embodiments, the free-running frequency of the injection-locked oscillator is tuned such that the frequency of the phase-modulated signal is substantially an Nth harmonic of the free-running frequency.

In some embodiments, the oscillator includes at least two phase-shifted output taps, and multiplication of the frequency of the oscillator output is performed by combining signals from the phase-shifted output taps with at least one XOR gate.

In an exemplary method of generating an amplitude-limited replica of an RF input signal, the RF input signal is injected at an Nth harmonic input of an injection-locked oscillator, where the frequency of the RF input signal is substantially N times a fundamental frequency of the injection-locked oscillator. While the RF input signal is injected, the injection-locked oscillator is operated to generate an oscillator output signal. The oscillator output signal is frequency-multiplied by a factor of N to generate the amplitude-limited replica signal. The value of N based on the frequency of the input signal. In some embodiments, N is an integer greater than one.

In some embodiments, an envelope elimination circuit is provided for generating an amplitude-limited replica of an RF input signal. The injection-locked oscillator has an Nth harmonic input and an oscillator output. The Nth harmonic input being adapted to receive the RF input signal. The circuit includes a frequency multiplier having an input and a frequency-multiplied output. The multiplier input is connected to the oscillator output. The frequency multiplier is operative to frequency-multiply the input by a factor of N, and the frequency-multiplied output is operative to provide the amplitude-limited replica of the RF input signal.

In some embodiments, the envelope elimination circuit is attached to a controller, where the controller is operative to select the value of N based on the frequency of the input signal, and the frequency multiplier is a variable frequency multiplier operative to multiply by the selected value of N. The circuit may further include injection selection circuitry connected to the controller, where the injection selection circuitry is operative to connect the input signal to a set of injection points corresponding to the Nth harmonic.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
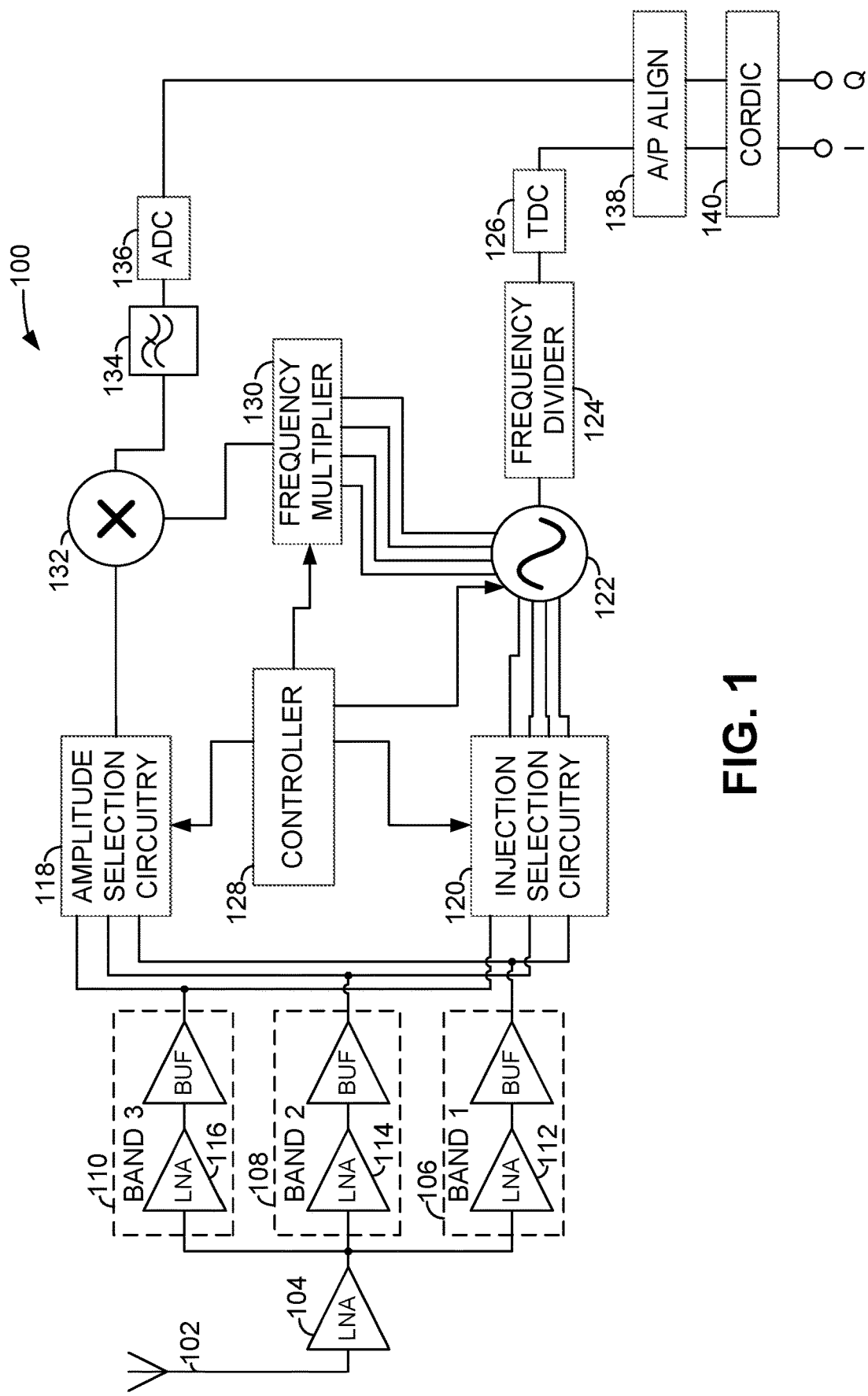
FIG. 1 is a functional block diagram of a polar receiver circuit according to some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

An exemplary polar receiver 100 according to some embodiments is illustrated in FIG. 1. A phase-modulated radio-frequency input signal is received at an input node, such as an antenna 102. The incoming radio-frequency signal is amplified by a wideband low-noise amplifier (LNA) 104, which also provides impedance matching to the antenna 102. The polar receiver 100 operates to receive and decode frequency modulated or phase-modulated radio-frequency signals, such as signals modulated using phase shift keying (PSK) or quadrature amplitude modulation (QAM). As the term is used in the present disclosure, phase-modulated signals refers to signals of varying types that include a phase-modulation component, and thus includes signals that are modulated in phase (e.g., binary phase-shift keying, quadrature phase-shift keying, 8-PSK, or 16-PSK) as well as signals that are modulated in both phase and amplitude (e.g., 16-QAM, 64-QAM, or 256-QAM). Frequency modulated signals include, among others, frequency shift keying (FSK) signals such as binary frequency-shift keying (BFSK) signals, multiple frequency-shift keying (MFSK) signals, and minimum-shift keying (MSK) signals.

While some of the embodiments described herein refer to the demodulation of phase-modulated signals, it should be noted that the disclosed embodiments can also be used to demodulate frequency-modulated (FM) signals, based on the mathematical relationship between changes in frequency and changes in phase. Both phase-modulated and frequency-modulated signals are modulated signals that have a variable phase component.

After amplification by the wideband LNA 104, the input signal is further amplified along one or more of a plurality of band-specific low-noise amplifier paths 106, 108, 110. While three band-specific amplifier paths are illustrated in FIG. 1, a lesser or greater number of amplifier paths may be used. Each of the amplifier paths 106, 108, 110 may include a respective band-specific tunable LNA 112, 114, 116 having relatively high gain around a selected center frequency and relatively lower gain at other frequencies, allowing each amplifier path to provide bandpass filter functionality in addition to amplification.

The practical frequency tuning range of each amplifier path may be limited. Thus, the different amplifier paths may have different frequency tuning ranges. For any input signal frequency $f_{in}$ within the operating range of the polar receiver 100, it is desirable for there to be at least one amplifier path that is tunable to frequency $f_{in}$. It should be noted that there may be some overlap in the tuning ranges along low-noise amplifier paths 106, 108, 110. Also, it should be noted that the frequency operating range of the polar receiver 100 is not necessarily continuous. For example, it may be desirable for the receiver to have the ability to receive and decode signals in the 2.4 GHz and 5 GHz Wi-Fi bands, but not necessarily to receive and decode signals in frequencies between those bands.

Along band-specific amplifier path 106, tunable LNA 112 provides amplification for frequencies in a first frequency band BAND 1. Along band-specific amplifier path 108, tunable LNA 114 provides amplification for frequencies in a second frequency band BAND 2. Along band-specific amplifier path 110, tunable LNA 116 provides amplification for frequencies in a third frequency band BAND 3.

In an exemplary embodiment, each of the band-specific tunable LNAs is implemented using the circuitry and techniques disclosed in U.S. Pat. No. 8,941,441, entitled "LNA with Linearized Gain over Extended Dynamic Range," issued Jan. 27, 2015, the entirety of which is incorporated herein by reference.

Figure 12:
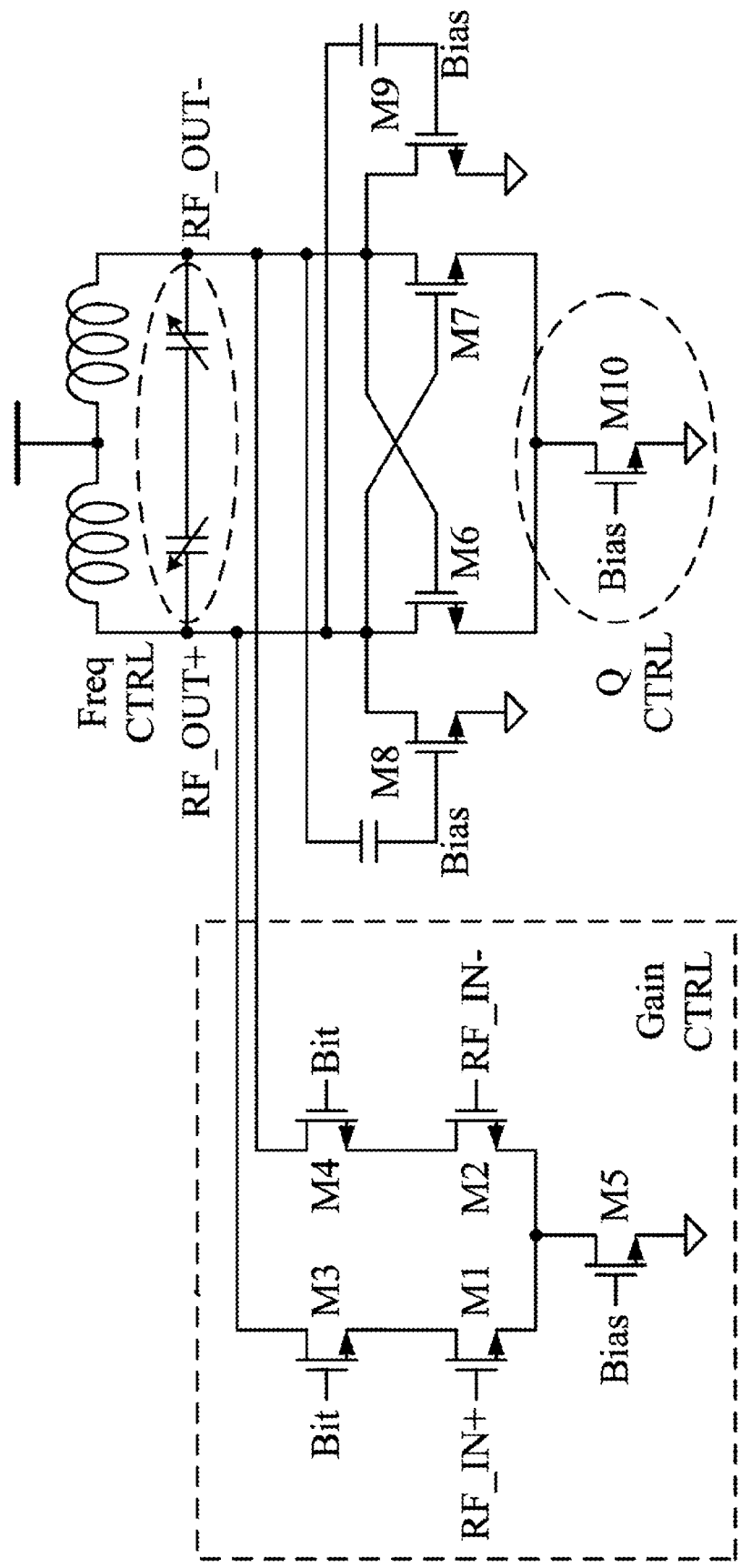
FIG. 12 is a circuit diagram of one embodiment of an adjustable LNA stage in accordance with some embodiments.

With reference to FIG. 12, the tunable LNA stage is depicted. The variable gain stage including the differential pair M1, M2, and the control FETs M3, M4 controlled by a Bit signal from the controller, is configured to provide a variable transconductance gain to drive the bandpass filter load. The LNA stage may include a plurality of switchable transconductance cells. The controller may use a binary code to adjust the gain, wherein each cell provides twice the gain of the prior cell. In addition, or as an alternative, some or all of the gain stage cells may provide equal amounts of gain, and may be controlled by a thermometer code control signal.

Again with respect to FIG. 12, the bandpass filter acting as the load for the transconductance gain stage includes an adjustable, or tunable tank circuit with frequency control (Freq CTRL). The tank circuit may be an LC tank as shown, or may alternatively be an RC tank circuit. The adjustable capacitors may take the form of a capacitor bank. Each capacitor may be controlled individually by using a separate bit to control its corresponding switch. The capacitors in the capacitor bank may take the same value or different values such that each bit controls a capacitance cell having a proportionally larger amount of capacitance. Capacitance variations may be accomplished by using varying configurations of serially connected and/or parallel connected capacitors, by using different device sizes, or by using different bias voltages, as just a few examples of embodiments of a capacitance bank.

The bandpass filter also includes cross-coupled transistors M6, M7 to complete the bandpass load. Note the cross-coupled compensation transistor pair M8, M9. These cross-coupled compensation transistors are biased in a sub-threshold region.

The quality factor Q of the bandpass load may also be adjusted. In one embodiment, the bias on transistor M10 is adjusted. A very high Q may be used, even as high as 400 or 500, while still maintaining a linearized response from the bandpass load at high output swing (100 mVp). The high-Q tank, or bandpass load, presents a large resistance to the transconductance gain stage, which will therefore produce a large gain from a small current signal. Note also that the high Q provides narrow band selection and high rejection of adjacent bands or channels. The Q may also be reduced by selectively inserting resistances in the tank circuit under the control of the LNA control circuit.

Figure 13:
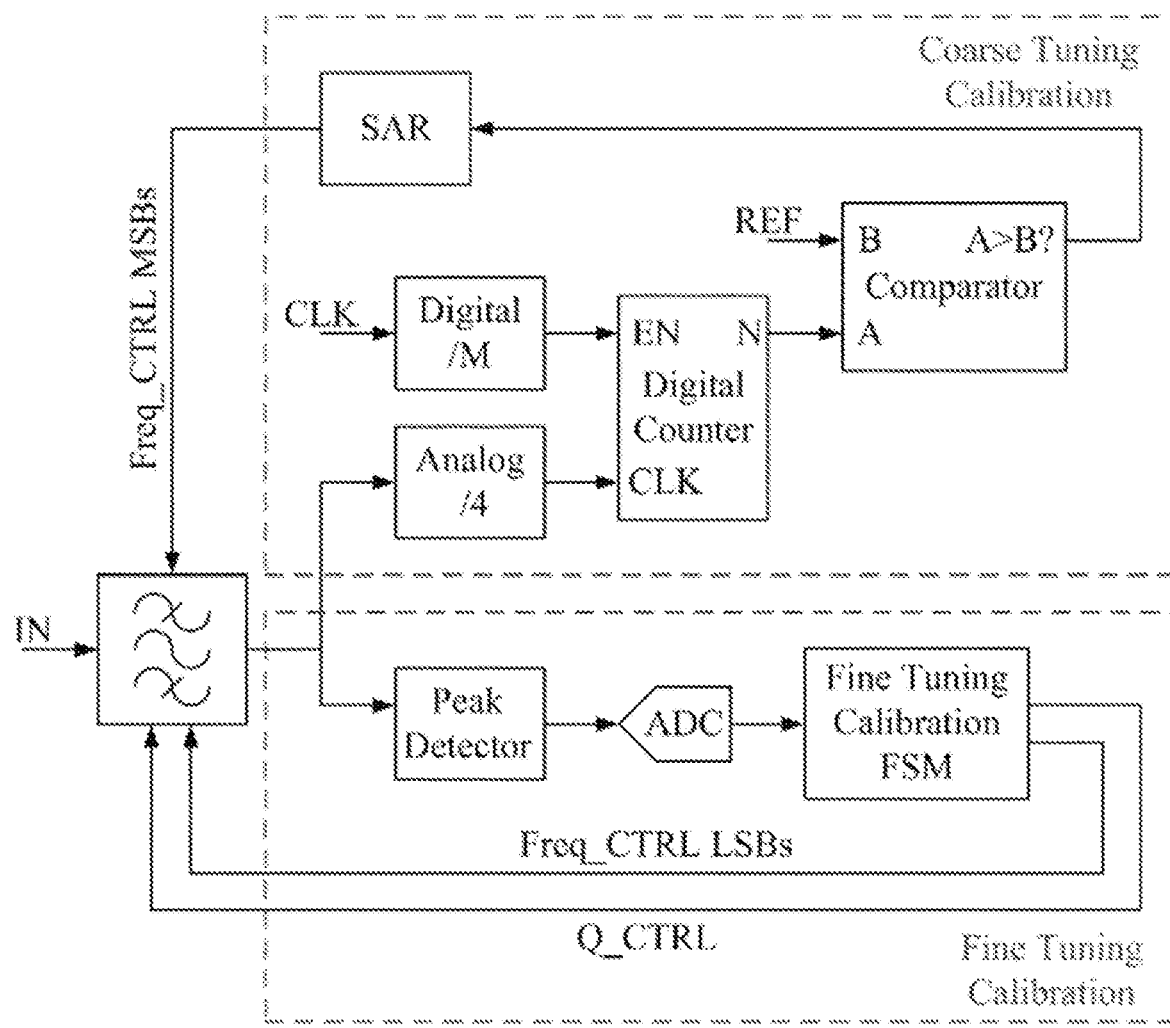
FIG. 13 is a control circuit configured to control the LNAs in accordance with some embodiments.

One apparatus and method of controlling and/or calibrating the LNA stages is depicted in FIG. 13 in accordance with some embodiments.

The LNA controller may include a finite state machine to control the circuits and/or modules of the controller. The LNA may be driven to oscillation during one or more steps of the calibration. A frequency detector may comprise a digital divide by M to divide a clock signal, and an analog divide by 4 (or other number) circuit to reduce the frequency of the monitored oscillations from the LNA bandpass load in the form of an LC tank.

The LNA controller may be configured to provide a control output signal on the frequency control output line corresponding to the most significant bits from the coarse tuning circuit, and corresponding to the least significant bits from the fine tuning control circuit. These bits may be used to switch a capacitor bank to alter the resonant frequency of the bandpass load. In the coarse tuning mode, the Q of the LNA may be increased to point of causing the LNA to oscillate. The frequency at which the LNA resonates is related to the peak of the frequency response when not in oscillation. Thus, the oscillatory condition induced in the LNA may be used to coarsely adjust the tank circuit capacitance. In the fine tuning mode, the controller generates one or more tones and measures the amplitudes to determine both a 3 dB point (which measures the Q) as well as the frequency at which a peak output may be obtained, which corresponds to the center frequency of the bandpass filter. Other tones and measurements may also be used to determine a fine calibration of the LNA.

The control output may include multiple parallel bits for controlling the Q factor of the LNA stages. The LNA controller may responsively adjust the Q by altering a bias current in the bandpass load circuit.

In an exemplary embodiment, BAND 1 encompasses frequencies from 800 MHz to 1.6 GHz, BAND 2 encompasses frequencies from 1.6-3.2 GHz, and BAND 3 encompasses frequencies from 3.2-6.4 GHz. In such embodiments, the polar receiver 100 may employ band-specific amplifier path 108 (corresponding to BAND 2) to amplify and filter signals in the 2.4 GHz WiFi band and band-specific amplifier path 110 (corresponding to BAND 2) to amplify and filter signals in the 5 GHz WiFi band. In some embodiments, the path 106 (corresponding to BAND 1) is not included.

In the embodiment of FIG. 1, the polar receiver 100 is provided with amplitude selection circuitry 118 to select which amplifier path output (and thus which band) is to be further processed for amplitude detection. It should be noted that, while amplitude selection circuitry 118 is illustrated as being "downstream" of the amplifier paths, the amplitude selection circuitry may be entirely or in part integrated with or provided "upstream" of the amplifier paths. For example, the amplitude selection circuitry may operate to direct the output of wideband LNA 104 to only a selected one of the amplifier paths, or the amplitude selection circuitry may deactivate (e.g. interrupt cut off a current source to) all amplifier paths other than a selected one of the amplifier paths.

Phase Detection.

In the embodiment of FIG. 1, the polar receiver 100 is provided with an injection-locked oscillator (ILO) 122 for use in phase detection. The injection-locked oscillator 122 includes a plurality of injection points, and the polar receiver 100 is provided with injection selection circuitry 120 that is operative to connect the amplified input signal to a selected set of injection points. As is discussed in further detail below, which set of injection points is used for a particular input signal is determined based on the frequency of the input signal. Depending on the frequency of the input signal, the set of injection points used may consist of a single injection point, a plurality of injection points, or all injection points. In some embodiments, the injection selection circuitry 120 is also operative to determine the phases at which the signal is injected at different injection points. For example, where the amplified input signal is a differential signal that includes two signals separated by a phase shift of 180°, the injection selection circuitry 120 may be operative to connect each of the signals to one or more different injection points. In some embodiments (e.g. as in FIG. 1), the injection selection circuitry 120 also operates to determine which one of the amplified signal outputs from the different band-specific amplifier paths is connected to the injection-locked oscillator 122. In other embodiments (e.g., in the embodiment of FIG. 8), the injection selection circuitry does not itself make the selection of which band-specific amplifier path is used, but does determine how the output of the selected path is connected to the injection-locked oscillator 122.

When no signal is being injected, the injection-locked oscillator 122 oscillates at a free-running frequency. In some embodiments, the injection-locked oscillator 122 is a tunable injection-locked oscillator with an adjustable free-running frequency. The injection-locked oscillator 122 is operable to lock onto an input signal when the frequency of the input signal, divided by an integer N (with N≥1), is within a locking range of the oscillator, for at least some value of N. Expressed differently, the oscillator is able to lock when the frequency of the input signal is an Nth harmonic of a frequency within the locking range of the oscillator, for at least some value of N. It should be noted that the locking range of the oscillator may vary when the oscillator is tuned, the locking range may be different for different harmonics, and the locking range may be affected by the amplitude of the injected input signal. Thus, the locking range of the oscillator is interpreted in light of other relevant parameters. As one example, the locking range may be greater when an input signal is a first harmonic (N=1, with the frequency of the input signal being substantially equal to the frequency of an output signal from oscillator) than when an input signal is a second harmonic (N=2, with the frequency of the input signal being substantially twice as great as the frequency of the oscillator output signal).

As a more specific example, the oscillator 122 may have a free-running frequency that is tunable between about 800 MHz and 1.6 GHz. If the input signal has a frequency of approximately 5 GHz, then, using fourth harmonic injection, the oscillator 122 can be tuned such that 5 GHz÷4, i.e. 1.25 GHz, is within the locking range of the oscillator. This may be done by tuning the free-running frequency of the oscillator to approximately 1.25 GHz. If the input signal has a frequency of approximately 2.4 GHz, then, using second harmonic injection, the oscillator 122 can be tuned such that 2.4 GHZ÷2, i.e. 1.2 GHz, is within the locking range of the oscillator. This may be done by tuning the free-running frequency of the oscillator to approximately 1.2 GHz. Thus, the injection-locked oscillator is able to lock on to the input signal when an appropriate value of N is selected (an appropriate harmonic is selected) and the oscillator is tuned such that the frequency of the input signal is substantially the Nth harmonic of the oscillator output frequency.

As noted above, the injection-locked oscillator 122 includes a plurality of injection points. Under the proper conditions, the oscillator 122 may lock onto an Nth harmonic input signal even if the input signal is injected only at a single point. However, the performance of the oscillator 122 can be improved by judicious selection of injection points. For example, the ability of the oscillator 122 to lock onto and faithfully follow an Nth harmonic input signal can be improved by selecting a set of injection points that increase the locking range for the Nth harmonic. (A set of injection points that decreases the locking range for harmonics other than the Nth harmonic may also be desirable.) Once a harmonic has been selected for injection, the injection selection circuitry 120 operates to provide the input signal at a set of injection points tailored to the selected harmonic. In some embodiments, a digital controller 128 is provided to operate the injection selection circuitry. The digital controller 128 may operate as described in greater detail with respect to FIG. 9. The digital controller 128, may include, for example, a lookup table that associates a list of input frequencies with corresponding sets of injection points.

When the oscillator 122 is locked onto a harmonic input signal, it functions as an injection-locked frequency divider. When the oscillator 122 is locked onto an Nth harmonic input signal at frequency $f_{in}$, the oscillator output signal has a frequency $f_{out}$ that is substantially equal to $f_{in}÷N$. Phase shifts in the input signal introduce corresponding phase shifts in the oscillator output signal, with a phase shift of φ in the input signal being reflected by a phase shift of φ÷N in the output signal. The frequency division helps to enable phase detection on the incoming signal: using oscillator 122 as an injection-locked frequency divider, together, in some embodiments, with an additional frequency divider or dividers 124, brings the frequency of the signal low enough such that phase shifts can be detected with a time-to-digital converter (TDC) 126 or other componentry. The additional frequency divider 124 can be implemented using a harmonic injection-locked oscillator, a digital frequency divider, or a combination thereof, among other possibilities. Phase detection using a time-to-digital converter can be performed using, among other techniques, the techniques described in U.S. Pat. No. 9,497,055, entitled "Method and Apparatus for Polar Receiver with Digital Demodulation," issued Nov. 15, 2016, the entire disclosure of which is incorporated herein by reference.

Amplitude Detection.

As noted above, the injection-locked oscillator 122 operates to divide the frequency of the input signal by a selected value of N when the input signal is the Nth harmonic of the oscillator output signal. In the embodiment of FIG. 1, frequency multiplier 130 is a variable frequency multiplier capable of multiplying by at least two different factors. In receiver 100, variable frequency multiplier 130 operates to multiply the oscillator output signal by the selected factor N, which results in a signal with the same frequency as that of the input signal. The injection-locked oscillator 122 and the frequency multiplier 130 together operate as an envelope elimination circuit by removing amplitude variations from the input signal. The output of the frequency multiplier 130 is thus an amplitude-limited replica of the input signal. The amplitude-limited replica signal is provided to a mixer 132, such as a Gilbert cell, that multiplies the amplitude-limited replica signal by the (possibly amplitude-modulated) input signal selected by the amplitude selection circuitry 118. The product of the amplitude-limited replica signal is a mixed signal that has a low frequency (or DC) component proportional to the amplitude of the input signal. A low-pass filter 134 filters out high-frequency components of the mixed signal, leaving an analog signal proportional to the amplitude of the input signal. An analog to digital converter (ADC) 136 generates a digital signal that represents the amplitude of the input signal. In some embodiments, ADC 136 samples the amplitude of the modulated radio-frequency signal at 160 Msps.

In the embodiment of FIG. 1, the digital phase information from TDC 126 and the digital amplitude information from ADC 136 are aligned by A/P alignment circuitry 138, and the aligned digital phase and amplitude signals are provided to a to coordinate rotation digital computer (CORDIC) logic circuit 140. The CORDIC logic 140 is operative to identify in-phase (I) and quadrature (Q) components corresponding to the phase-modulated radio-frequency input signal. The identified in-phase and quadrature components may be used in turn to identify a particular symbol conveyed by the phase-modulated radio-frequency input signal, such as a quadrature amplitude modulation (QAM) symbol, using conventional techniques known to those skilled in the art.

In the embodiment of FIG. 1, the controller 128 operates to coordinate the amplitude selection circuitry 118, the injection selection circuitry 120, and the frequency multiplier 130. For example, the controller 128 may receive information identifying that an input signal is to be receive at a particular input frequency $f_{in}$. Based on the frequency $f_{in}$, the controller 128 determines which band-specific amplifier path should be used and tunes the appropriate tunable LNA accordingly; operates the amplitude selection circuitry 118 to connect the appropriate band-specific amplifier path to the amplitude detection circuitry; selects an appropriate harmonic value N for the frequency $f_{in}$; operates the injection selection circuitry 120 to select the appropriate set of injection points for the harmonic value N; tunes the injection-locked oscillator 122 to a free-running frequency near the frequency $f_{in} \div N$, and controls the frequency multiplier 130 to perform multiplication by the same factor of N.

Injection-Locked Ring Oscillator.

In some embodiments, the injection-locked oscillator 122 is an injection-locked ring oscillator. One such embodiment is illustrated by injection-locked ring oscillator 222 of FIG. 2. Oscillator 222 includes a sequence of four buffers 202, 204, 206, 208, which may be differential inverters. As is known to those skilled in the art, each of the buffers corresponds to a buffer phase shift of 45°, such that the sequence of four buffers collectively generate a total buffer phase shift of 180°, with the output of the sequence of buffers being crossed over at point 210 and fed back into the sequence.

Figure 2:
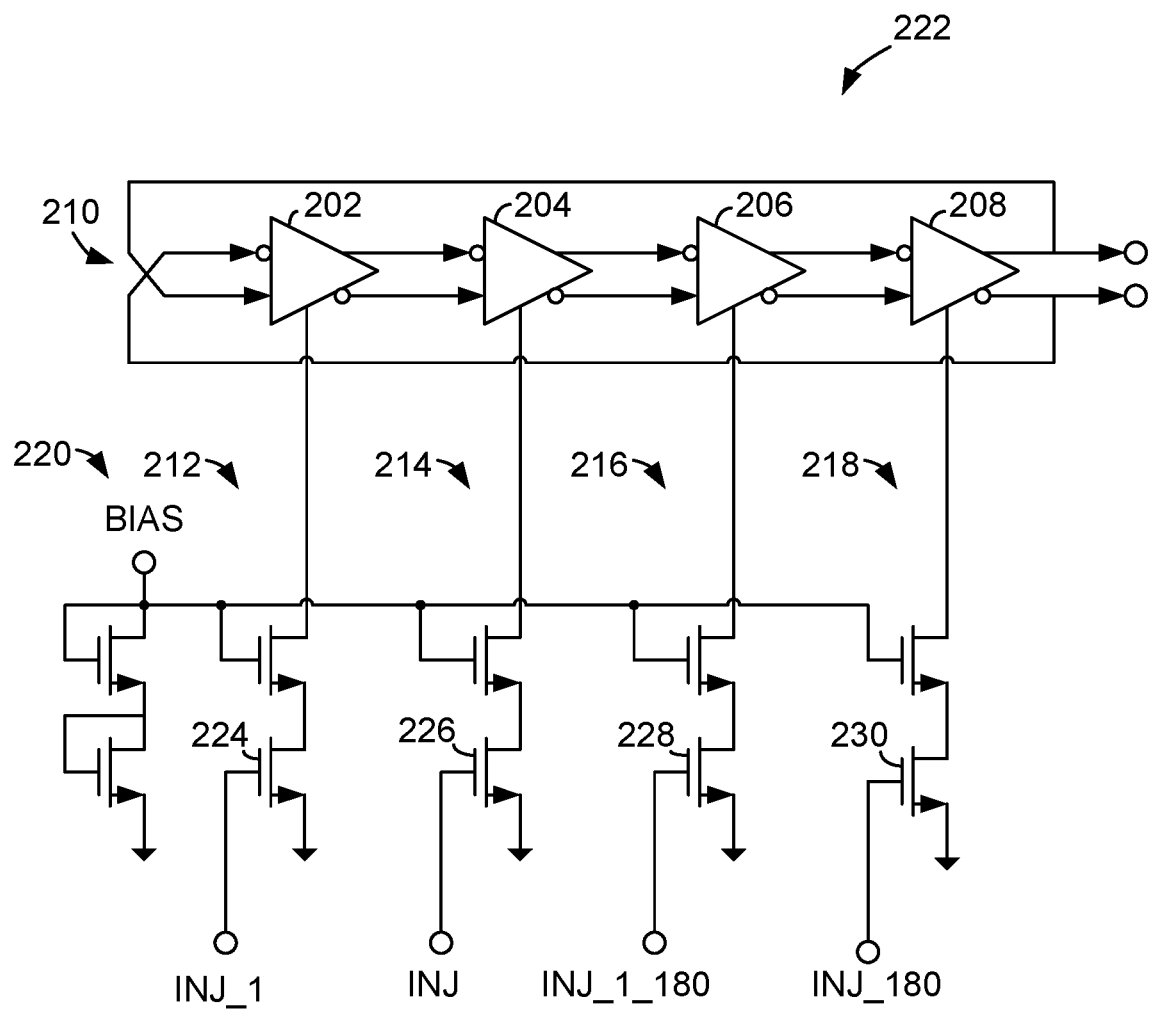
FIG. 2 is a schematic diagram of an injection-locked ring oscillator circuit with a plurality of injection points according to some embodiments.

The injection-locked ring oscillator 222 includes current sources 212, 214, 216, 218 that supply current to respective buffers 202, 204, 206, 208. The current sources are biased by a biasing circuit 220. In the embodiment of FIG. 2, the injection points are provided at the gates of field-effect transistors (FETs) 224, 226, 228, 230 that modulate the current provided to respective buffers 202, 204, 206, 208. The respective injection points are labeled INJ_1, INJ, INJ_1_180, and INJ_180. As described in greater detail below with respect to FIG. 3, injection selection circuitry connects an input signal to a set of these injection points (e.g. to one of the injection points, a selected few of the injection points, or to all of the injection points).

In some embodiments, the injection-locked ring oscillator 222 is a tunable oscillator. In some such embodiments, one or more (or all) of the buffers 202, 204, 206, 208 is provided with one or more adjustable capacitive elements and/or adjustable resistive elements capable of adjusting a delay introduced by the buffer. In some embodiments, the delay is digitally adjustable based on input from a controller such as controller 128 of FIG. 1. Lengthening the delay of each buffer lengthens the period of oscillations and lowers the free-running frequency of the oscillator. In the four-buffer configuration of FIG. 2, each buffer provides a buffer phase shift of 45° (180°÷4), so that the period of oscillations is eight times the delay introduced by each buffer (with the free-running frequency being inverse of that period). A different number of buffers may be used in other embodiments. For example, an injection-locked ring oscillator may be implemented using a sequence of eight buffers (which may be inverters). In such an embodiment, each buffer introduces a buffer phase shift of 22.5° (180°÷8), and the oscillation period is sixteen times the delay introduced by each buffer.

When it is desired to inject a differential input signal into oscillator 222 at the second harmonic (i.e. N=2), the differential signal is, in an exemplary embodiment, injected at a set of injection points that are separated by a buffer phase shift of 90°, for example at injection points INJ and INJ_180. When it is desired to inject a differential input signal into oscillator 222 at the fourth harmonic (i.e. N=4), the differential signal is, in an exemplary embodiment, injected at a set of injection points that are separated by a buffer phase shift of 45°, for example at injection points INJ_1 and INJ, or INJ_1_180 and INJ_180 (or at all four of those injection points simultaneously). In embodiments that support injection at the first harmonic, the corresponding set of injection points may be a single injection point, e.g. at point INJ.

Injection Selection Circuitry.

Figure 3:
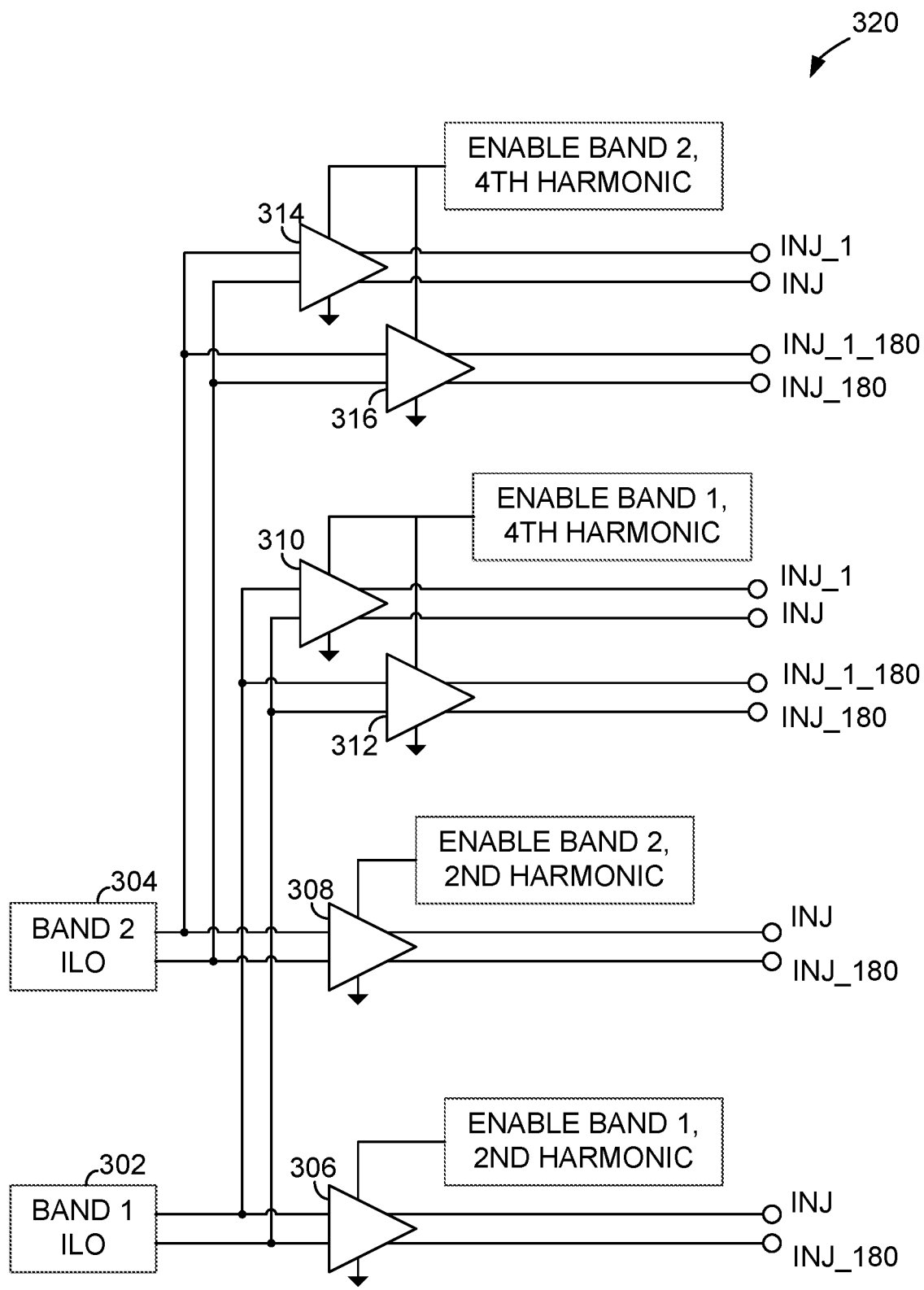
FIG. 3 is a schematic diagram of injection selection circuitry according to some embodiments.

Exemplary injection selection circuitry 320 is illustrated in FIG. 3. The injection selection circuitry 320 is operative to selectively connect either a first band-specific amplifier 302 or a second band-specific amplifier 304 to a selected set of injection points. The injection points illustrated in FIG. 3 are labeled INJ_1, INJ, INJ_1_180, and INJ_180 and may be the injection points with corresponding labels illustrated in FIG. 2.

When it is desired to inject an input signal in BAND 1 at the second harmonic, buffer 306 is activated, while other buffers in the injection selection circuitry are disconnected. The activation of buffer 306 connects the input signal from amplifier 302 to a selected set of injection points associated with the second harmonic, specifically points INJ and INJ_180.

When it is desired to inject an input signal in BAND 2 at the second harmonic, buffer 308 is activated, while other buffers in the injection selection circuitry are disconnected. The activation of buffer 308 connects the input signal from amplifier 304 to a selected set of injection points associated with the second harmonic, specifically points INJ and INJ_180.

When it is desired to inject an input signal in BAND 1 at the fourth harmonic, buffers 310 and 312 are activated, while other buffers in the injection selection circuitry are disconnected. The activation of buffers 310 and 312 connects the input signal from amplifier 302 to a selected set of injection points associated with the fourth harmonic, specifically points INJ_1, INJ, INJ_1_180, and INJ_180.

When it is desired to inject an input signal in BAND 2 at the fourth harmonic, buffers 314 and 316 are activated, while other buffers in the injection selection circuitry are disconnected. The activation of buffers 314 and 316 connects the input signal from amplifier 304 to a selected set of injection points associated with the fourth harmonic, specifically points INJ_1, INJ, INJ_1_180, and INJ_180.

The signals used to activate or disconnect buffers 306, 308, 310, 312, 314, and 316 are provide in some embodiments by a controller such as controller 128 of FIG. 1. While FIG. 3 provides an exemplary circuit for implementation of injection selection circuitry, it will be apparent to those skilled in the art with the benefit of the present disclosure that other circuits can be constructed to selectively connect input signals to different sets of injection points associated with different harmonics.

Amplitude Selection Circuitry.

Figure 4:
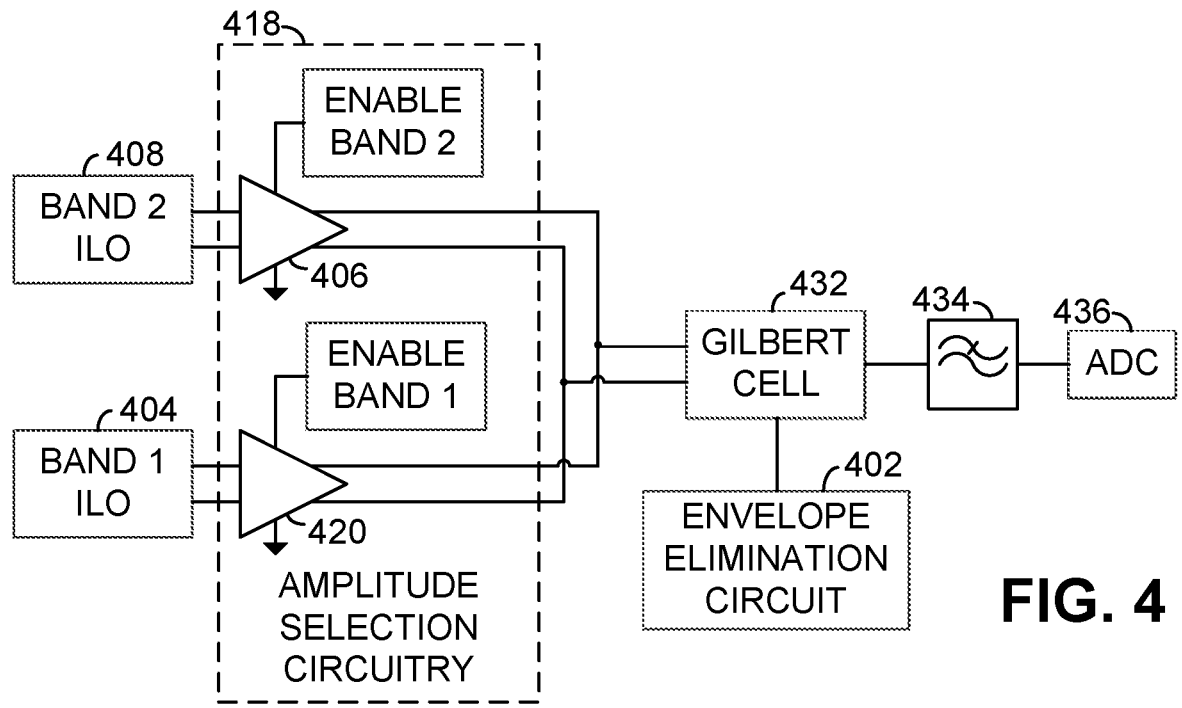
FIG. 4 is a schematic diagram illustrating amplitude selection circuitry according to some embodiments.

As in the case of injection selection circuitry, various different circuits can be used to implement amplitude selection circuitry. One such exemplary circuitry is illustrated in FIG. 4. In FIG. 4, a Gilbert cell 432 is used as mixer in the amplitude detection path. The Gilbert cell 432 operates to multiply an amplitude-limited replica of the input signal, provided by envelope elimination circuit 402, with the input signal selected by amplitude selection circuitry 418. When a signal in BAND 1 is desired, buffer 420 is activated to connect band-specific amplifier 404 with the Gilbert cell 432. When a signal in BAND 2 is desired, buffer 406 is activated to connect band-specific amplifier 408 with the Gilbert cell 432. The mixed signal generated by the Gilbert cell 432 may then be low-pass filtered by filter 434 and sampled by ADC 436 to generate a signal representative of the amplitude of the input signal selected by the amplitude selection circuitry.

Envelope Elimination Circuit.

Figure 5:
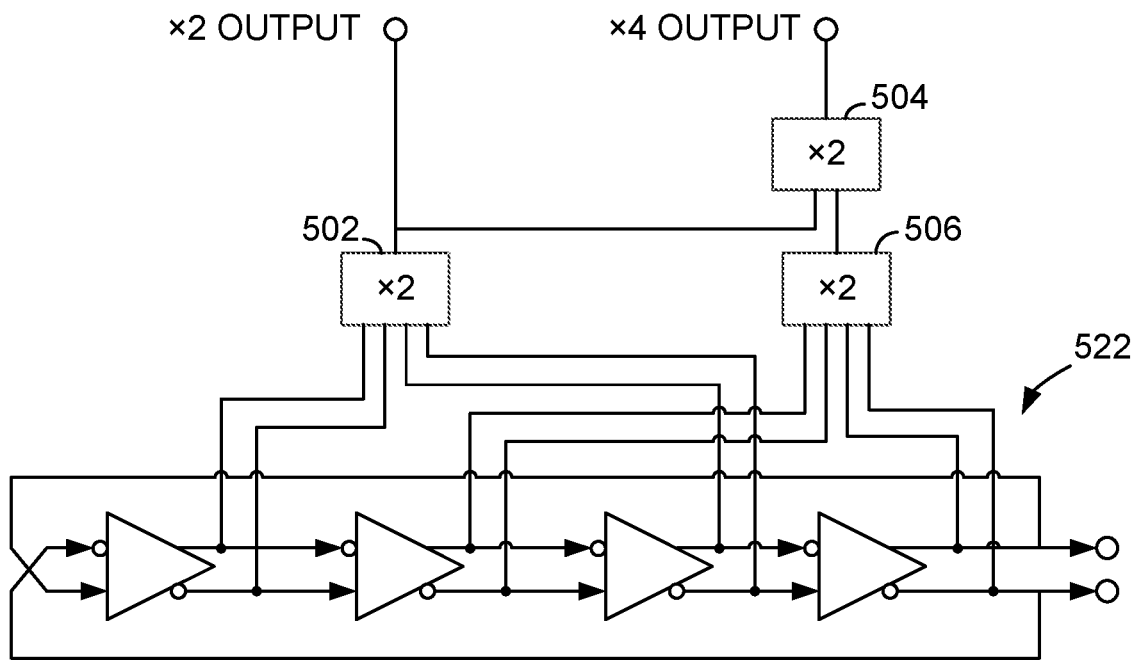
FIG. 5 is a schematic diagram illustrating envelope elimination circuitry according to some embodiments.

An exemplary envelope elimination circuit (such as circuit 402 of FIG. 4) is illustrated in FIG. 5. As illustrated in FIG. 5, one or more oscillator outputs of injection-locked oscillator 522 are provided to frequency multipliers 502, 504, and 506. In the example of FIG. 5, the multipliers 502, 504, and 506 are each operated to provide frequency-multiplied output signals that have twice the frequencies of their respective inputs. Frequency multipliers 504 and 506 are connected in series to provide a total frequency multiplication factor of four. When an input signal is injected into the injection-locked oscillator 522 at the second harmonic, the x2 output is used as the amplitude-limited replica of the input signal. When an input signal is injected into the injection-locked oscillator 522 at the fourth harmonic, the x4 output is used as the amplitude-limited replica of the input signal.

Figure 6:
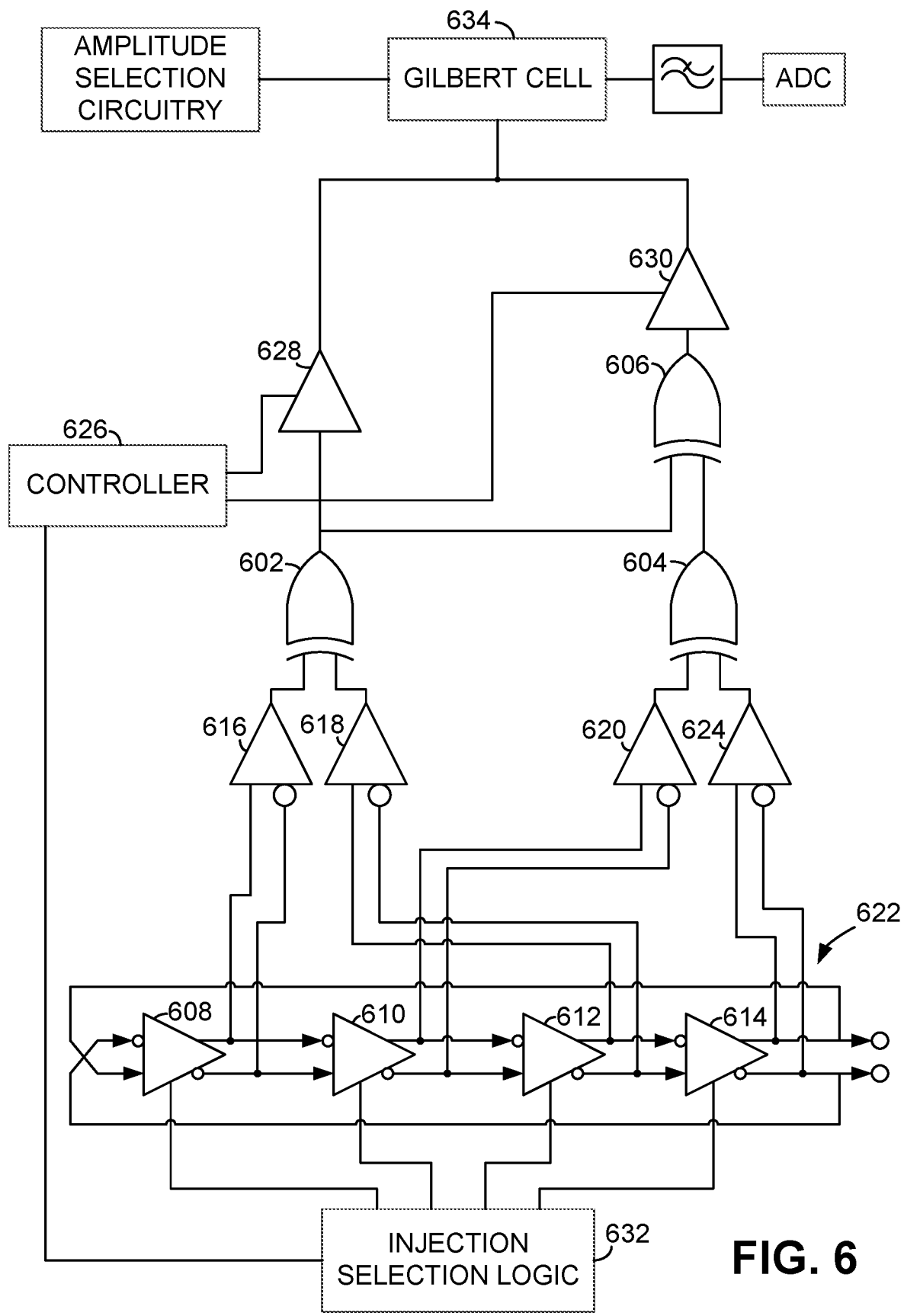
FIG. 6 is a schematic diagram illustrating use of envelope elimination circuitry in a polar receiver according to some embodiments.

The envelope elimination circuitry is illustrated in greater detail in FIG. 6. In the embodiment of FIG. 6, the frequency multipliers are implemented using XOR gates 602, 604, 606. Injection-locked oscillator 622 has differential oscillator output signals from output taps corresponding to buffers 608, 610, 612, 614. These differential oscillator output signals are converted to single-ended signals by buffers 616, 618, 620, 624. The output taps corresponding to oscillator buffers 608 and 612 are separated by a total phase difference of 90°, and applying an XOR function to those outputs by XOR gate 602 gives a frequency-multiplied output signal that is twice the frequency of the individual oscillator output signals. The output taps of oscillator buffers 610 and 614 are likewise separated by a total phase difference of 90°, and applying an XOR function to those outputs by XOR gate 604 gives a frequency-multiplied output signal that is twice the frequency of the individual oscillator output signals. The outputs of XOR gates 602 and 604 are then XORed together by XOR gate 606, which provides a frequency-multiplied output signal that is four times the frequency of the individual oscillator output signals. A controller 626 activates buffer 628 to use the x2 output from XOR gate 602 or buffer 630 to use the x4 output from XOR gate 606.

The controller 626 operates the buffers 628 and 630 and the injection selection logic 632. When an input signal is to be injected into the modulator at the second harmonic, the controller 626 operates the injection selection logic 632 to inject the input signal at a set of one or more injection points associated with the second harmonic, and the controller further activates buffer 628 to provide the x2 output to the Gilbert cell 634. Thus, in the case of second-harmonic injection, the oscillator 622 operates to divide frequency of the input signal by two, while the frequency multiplier circuitry (XOR gates 602, 604, 606 in this example) multiplies the frequency by two, restoring the original frequency of the input signal. Similarly, when an input signal is to be injected into the modulator at the fourth harmonic, the controller 626 operates the injection selection logic 632 to inject the input signal at a set of one or more injection points associated with the fourth harmonic, and the controller further activates buffer 630 to provide the x4 output to the Gilbert cell 634. Thus, in the case of fourth-harmonic injection, the oscillator 622 operates to divide frequency of the input signal by four, while the frequency multiplier circuitry multiplies the frequency by four, again restoring the original frequency of the input signal.

Exemplary Mixer.

Figure 7:
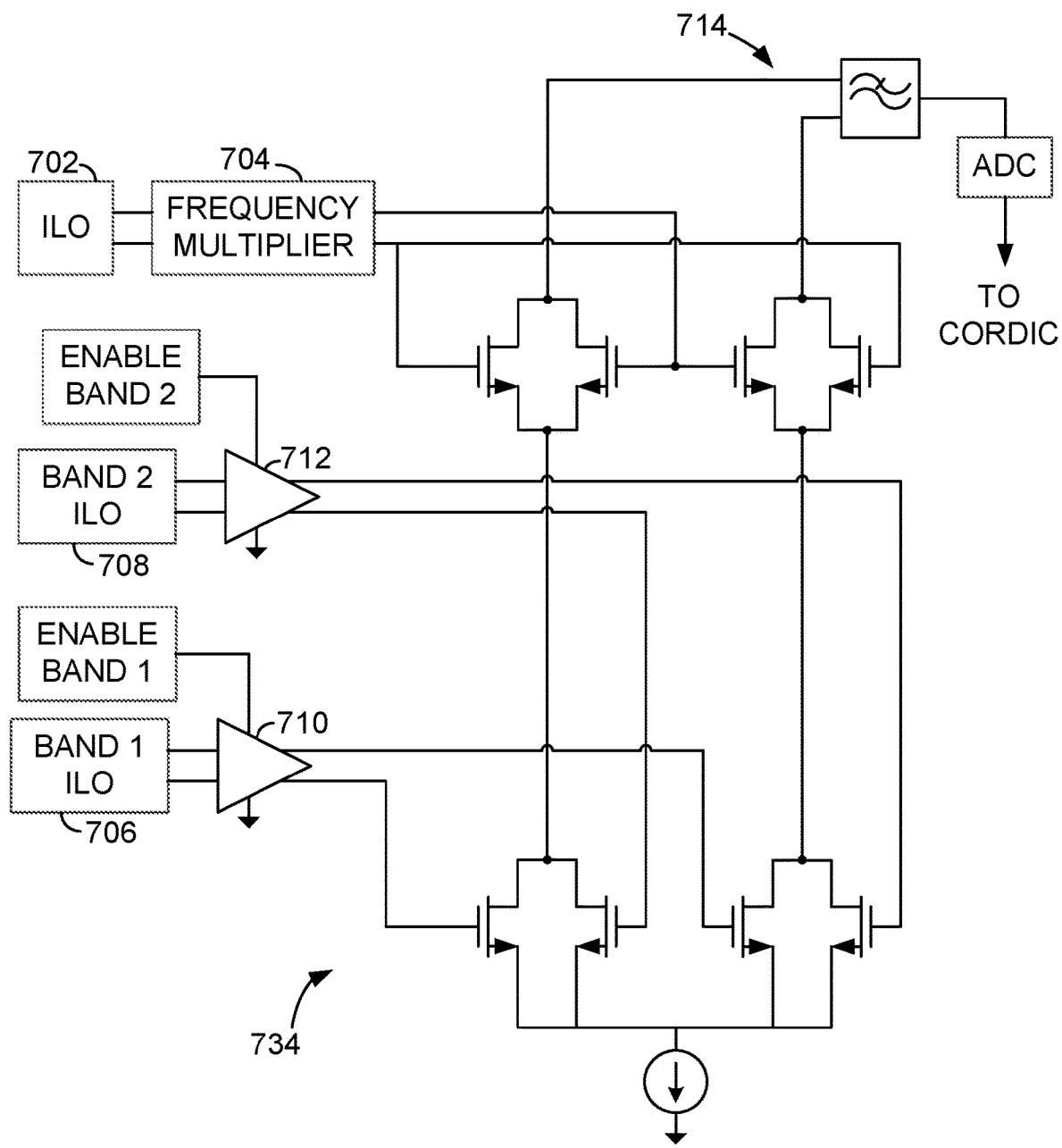
FIG. 7 is a schematic diagram illustrating a use of a Gilbert cell multiplication circuit in a polar receiver according to some embodiments.

An exemplary Gilbert cell employed as a mixer for amplitude detection is illustrated in FIG. 7. In the embodiment of FIG. 7, the Gilbert cell 734 receives a first input from an envelope elimination circuit that includes an injection locked oscillator 702 followed by a frequency multiplier 704. The Gilbert sell receives a second input from either amplifier 706 or amplifier 708, depending on whether buffer 710 or 712 is active. In some embodiments, in which unused amplifiers are disabled, buffers 710 and 712 may be eliminated.

In the example of FIG. 7, the differential output 714 of the Gilbert cell is low-pass filtered and sampled by an ADC. It may be noted that, for ease of illustration, some embodiments are illustrated herein as using single-ended signals while other embodiments are illustrated as using differential signals. It should be understood that, in various embodiments, single-ended signaling can be replaced with differential signaling, and vice-versa.

Alternative Architectures.

Figure 8:
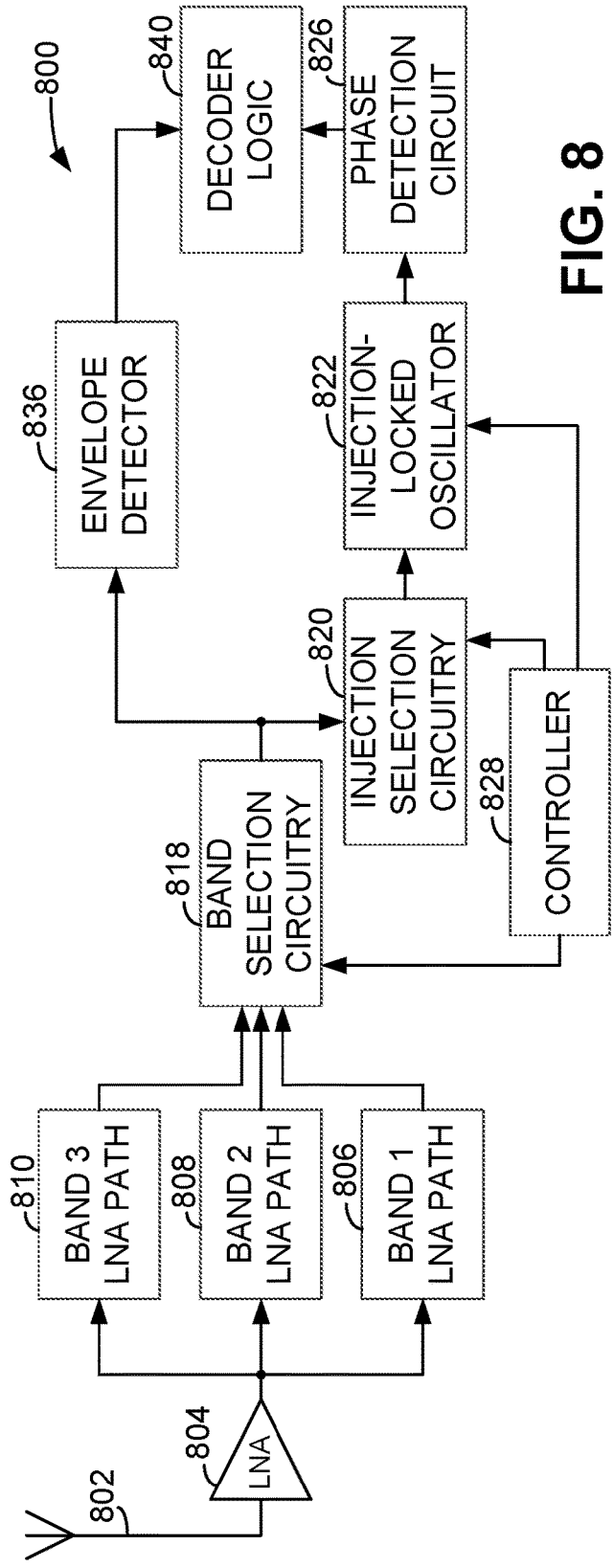
FIG. 8 is a functional block diagram illustrating an architecture of a polar receiver according to some embodiments.

An exemplary polar receiver 800 according to some embodiments is illustrated in FIG. 8. Polar receiver 800 exhibits a different architecture from polar receiver 100 of FIG. 1. In the receiver 800 of FIG. 8, a phase-modulated radio-frequency input signal is received at an input node, such as an antenna 802. The incoming radio-frequency signal is amplified by a wideband low-noise amplifier (LNA) 804, which also provides impedance matching to the antenna 802. The polar receiver 800 operates to receive and decode frequency modulated or phase-modulated radio-frequency signals.

After amplification by the wideband LNA 804, the input signal is further amplified along one or more of a plurality of band-specific low-noise amplifier paths 806, 808, 810. While three band-specific amplifier paths are illustrated in FIG. 8, a lesser or greater number of amplifier paths may be used. Each of the amplifier paths 806, 808, 810 may include a respective band-specific tunable LNA.

In the embodiment of FIG. 8, the polar receiver 800 is provided with band selection circuitry 818 to select which amplifier path output (and thus which band) is to be further processed for amplitude and phase detection. Polar receiver 800 is provided with an injection-locked oscillator (ILO) 822 for use in phase detection. The injection-locked oscillator 822 includes a plurality of injection points, and the polar receiver 800 is provided with injection selection circuitry 820 that is operative to connect the amplified input signal to a selected set of injection points. Note that, whereas injection detection circuitry 120 (FIG. 1) operates to select both a band specific amplifier and a set of injection points, injection detection circuitry 820 operates only to select a set of injection points; it is band selection circuitry 818 that selects a band-specific amplifier. Thus, injection selection circuitry may, but is not required to, select a particular band-specific amplifier. The injection selection circuitry operates to inject the amplified input signal at a set of injection points that corresponds to the harmonic at which injection is being conducted.

A controller 828 coordinates the activities of the band-selection circuitry 818, the injection selection circuitry 820, and injection-locked oscillator 822. Based on a selected input frequency, the controller 828 instructs the band selection circuitry 818 to select the appropriate band-specific amplifier for the input signal, instructs the injection selection circuitry 820 to inject the input signal at a set of injection points corresponding to the appropriate harmonic, and tunes the injection-locked oscillator 822 to a free-running frequency that is appropriate for the selected input frequency. The controller 828 may also tune one or more LNAs in the selected band-specific amplifier path to the frequency of the selected input signal. In alternative embodiments, a bandpass filter may be employed and may be tuned by the controller 828 the selected input frequency.

An envelope detector 836 operates to measure the amplitude of the input signal. Envelope detector 836 may operate using the techniques disclosed herein (e.g. the use of envelope elimination circuitry and a mixer) or more conventional techniques (e.g. rectification followed by low-pass filtering) to measure the amplitude of the input signal. Phase detection circuitry 826 operates to measure the phase of the input signal by determining the phase of the oscillator output signal. Decoder logic 840 operates to decode the phase-modulated input signal, for example by identifying a constellation point corresponding to the phase and amplitude of the input signal. Decoder logic 840 may include a CORDIC or other logic to determine in-phase (I) and quadrature (Q) values that correspond the incoming input signal.

Figure 9:
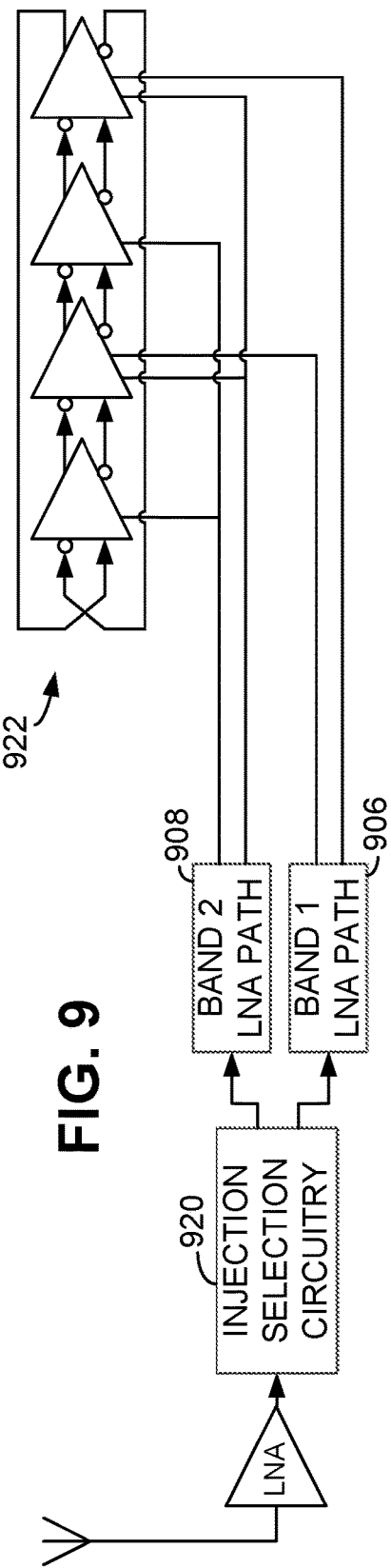
FIG. 9 is a functional block diagram illustrating a portion of a polar receiver with an alternative architecture according to some embodiments.

In some embodiments, the selection of a set of injection points may be coextensive with the selection of a band-specific amplifier. For example, each band-specific amplifier may be hardwired to a corresponding set of injection points, as illustrated in FIG. 9. FIG. 9 illustrates a portion of a polar receiver including injection selection circuitry 920 provided upstream of band-specific amplifier paths 906 and 908. Injection selection circuitry 920 selects a particular band-specific amplifier path (906 or 908) to be used for the input signal. In this particular example, all input signals processed by band-specific amplifier 908 are to be injected as a fourth harmonic, and thus amplifier 908 is hardwired to inject its amplified signal into the first, second, third, and fourth buffers (with alternating polarity) in injection-locked oscillator 922. Similarly, in this particular example, all input signals processed by band-specific amplifier 906 are to be injected as a second harmonic, and thus amplifier 906 is hardwired to inject its amplified signal into the second and fourth buffers (with alternating polarity) in injection-locked oscillator 922.

Polar Receiver Method.

Figure 10:
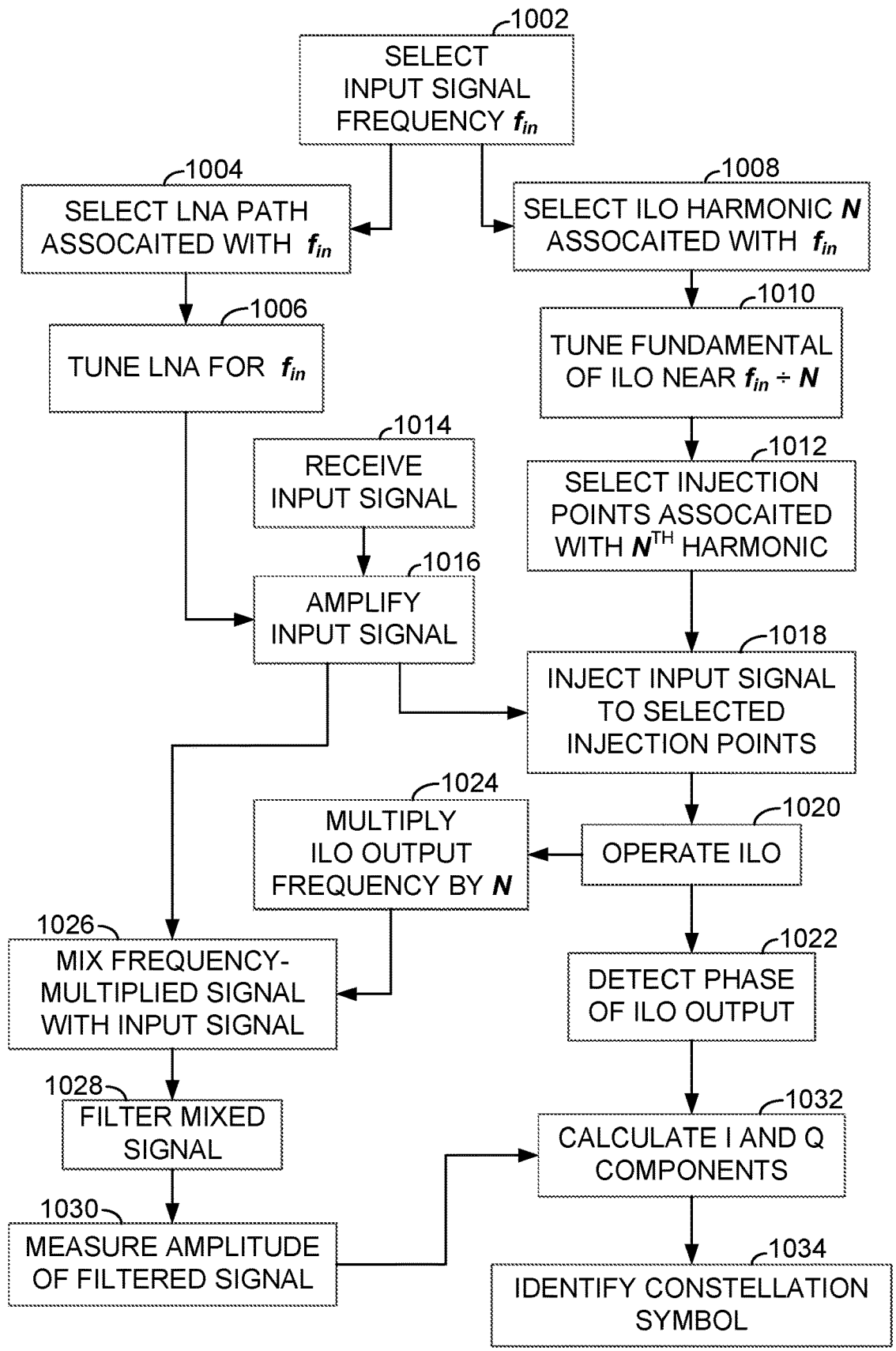
FIG. 10 is a flow diagram illustrating a method of operating a polar receiver according to some embodiments.

An exemplary method performed by a polar receiver in some embodiments is illustrated in FIG. 10. In step 1002, an input signal frequency $f_{in}$ is selected. For example, to receive a signal being sent on IEEE 802.11b/g/n Channel 1, an input signal frequency of 2412 MHz is selected. In step 1004, an appropriate band-specific amplifier path is chosen for the selected input signal frequency. For example, a polar receiver may have one amplifier path for use across the 2.4 GHz Wi-Fi band and another amplifier path for use across the 5 GHz band. For an input signal frequency of 2412 MHz, the amplifier path for 2.4 GHz would be selected. In step 1006, the selected amplifier path is tuned to the input signal frequency (2412 MHz, in this example).

In step 1008, an appropriate harmonic N is selected for injection of the input signal. Suppose, for example, that the injection-locked oscillator of the polar receiver capable of locking on frequencies between 800 MHz and 1600 GHz. (This locking range may be achievable in part by tuning of the free-running frequency of the injection-locked oscillator.) The selected input frequency of 2412 MHz is outside of this locking range, so the first harmonic is not selected. However, 2412 MHz is the second harmonic of 1206 MHz, which is within the locking range of the oscillator, so the second harmonic is selected (i.e., N is selected to be equal to 2). In step 1010, the free-running frequency of the oscillator is tuned to a frequency at or near the frequency $f_{in} \div N$. In step 1012, a set of injection points associated with the Nth harmonic is selected. (In some embodiments, as in the example of FIG. 9, selection of the LNA path in step 1004 may also affect the selection of the injection points.)

In step 1014, a phase-modulated radio-frequency input signal is received at the polar receiver. The input signal is amplified by the selected amplifier in step 1016. The amplified input signal is then processed to determine the phase and amplitude thereof.

In a phase processing method, the input signal is injected in step 1018 into an injection-locked oscillator at the selected set of injection points associated with the Nth harmonic. In step 1020, the injection-locked oscillator is operated to generate an oscillator output signal. In step 1022, the oscillator output signal is processed to determine the phase of the oscillator output signal (and thus, with the proper scaling, the phase of the input signal). This processing may be performed using, for example, one or more additional frequency dividers and a time-to-digital converter.

The oscillator output signal is also used in amplitude detection. In step 1024, the oscillator output signal is frequency-multiplied by the selected factor N to generate an amplitude-limited replica of the input signal. The amplitude of the amplitude-limited replica is substantially unaffected by changes to the amplitude of the input signal. In step 1026, the frequency-multiplied signal generated in step 1024 is mixed with the input signal. In step 1028, the mixed signal is low-pass filtered to generate a signal proportional to the amplitude of the input signal. This signal is measured in step 1030, for example by sampling using an analog-to-digital converter.

In step 1032, based on the phase and amplitude of the input signal as measured in respective steps 1022 and 1030, the in-phase (I) and quadrature (Q) components of the input signal are determined. Based on this determination, a constellation symbol conveyed by the input signal is determined in step 1034.

Tuning and Harmonic Selection.

Figure 11A:
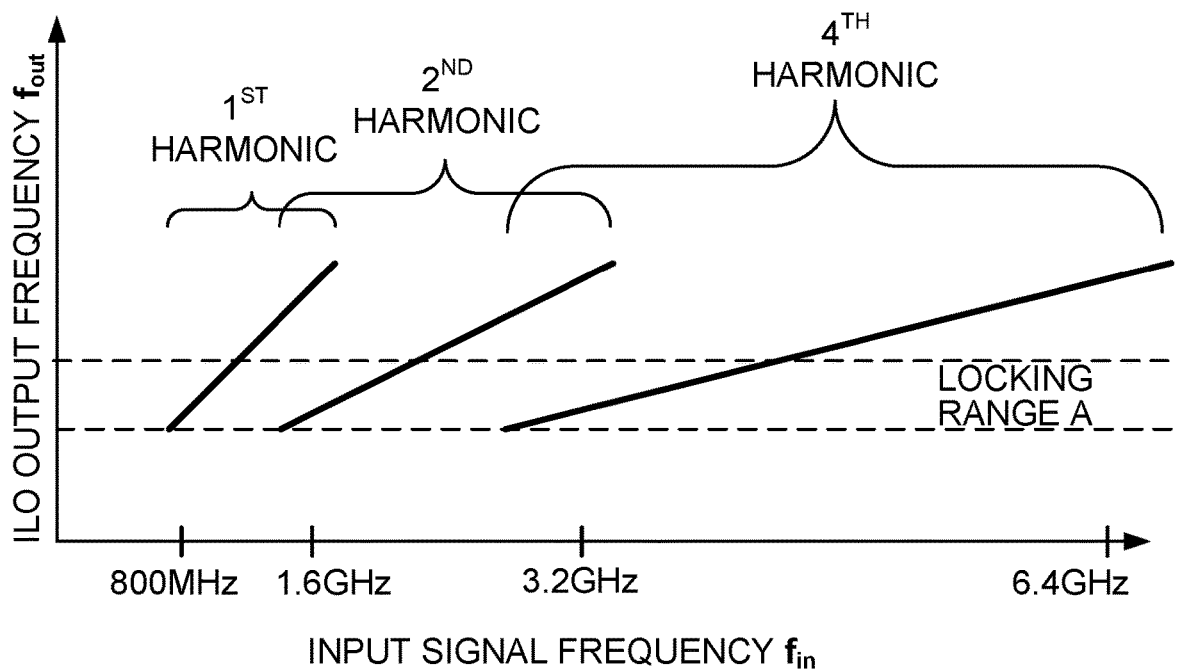
FIGS. 11A and 11B are graphs that schematically illustrate principles underlying selection of an Nth harmonic and tuning of an injection-locked oscillator according to some embodiments.

The graphs of FIGS. 11A and B illustrate the ability of polar receivers as disclosed herein to accommodate a wide range of input signal frequencies by allowing for signal injection at a plurality of different harmonics. FIGS. 11A and B are graphs representing possible injection-locked oscillator output frequencies $f_{out}$ for different harmonics N as a function of different input signal frequencies $f_{in}$. As illustrated in FIGS. 11A and B, a signal being injected at the first harmonic falls within the locking range of an exemplary oscillator only in the range of around 800 MHz-1.6 GHz. However, by selectively enabling injection at the second and fourth harmonics, input signals ranging from approximately 800 MHz-6.4 GHz can be accommodated.

Figure 11B:
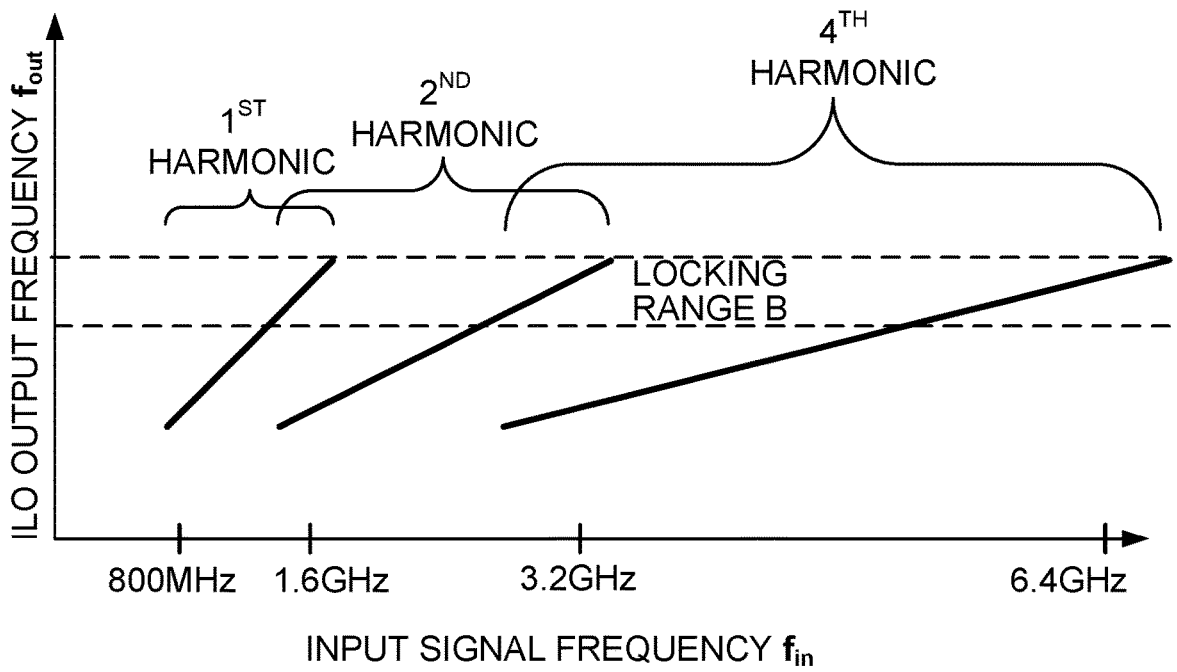

As seen in FIGS. 11A and B, if there is a wide enough locking range, it is possible for two different harmonics to fall within the locking range, which could theoretically cause unstable or metastable behavior by the oscillator. This risk can be addressed by appropriate tuning of the free-running frequency of the oscillator and by selection of appropriate injection points. In FIG. 11A, the oscillator is tuned to a relatively lower frequency, and with an input signal frequency of (for example) 1.6 GHz, the oscillator will lock on the second harmonic and provide an oscillator output signal of 800 MHz. In FIG. 11B, the oscillator is tuned to a relatively higher frequency, and with an input signal frequency of 1.6 GHz, the oscillator will lock on the first harmonic and provide an oscillator output signal of 1.6 GHz. Thus, the oscillator can be tuned to ensure that the oscillator locks on the proper harmonic. Locking on the correct harmonic is also promoted by selection of an appropriate set of injection points for a particular harmonic.

While exemplary sets of injection points for different harmonics are illustrated herein with respect to FIGS. 2 and 3, it should be understood that other sets of injection points can be selected. For example, it may be determined, for each harmonic to be implemented in a particular receiver, what set of injection points results in the greatest locking range for that harmonic. Such a determination can be readily made through straightforward experimentation or simulation by testing or simulating different possible sets of injection point at different harmonics. These determinations may be programmed or hard wired into a receiver such that, for a given input frequency, the receiver automatically selects the appropriate harmonic and the appropriate set of injection points for that frequency (without repeating the experimentation or simulation), for example by consulting a lookup table or applying predetermined rules.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Accordingly, some embodiments of the present disclosure, or portions thereof, may combine one or more processing devices with one or more software components (e.g., program code, firmware, resident software, micro-code, etc.) stored in a tangible computer-readable memory device, which in combination form a specifically configured apparatus that performs the functions as described herein. These combinations that form specially programmed devices may be generally referred to herein as "modules". The software component portions of the modules may be written in any computer language and may be a portion of a monolithic code base, or may be developed in more discrete code portions such as is typical in object-oriented computer languages. In addition, the modules may be distributed across a plurality of computer platforms, servers, terminals, and the like. A given module may even be implemented such that separate processor devices and/or computing hardware platforms perform the described functions.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

The invention claimed is:

1. A method comprising:
   receiving a phase-modulated input signal at a polar receiver including an injection-locked oscillator;
   operating the injection-locked oscillator to generate an oscillator output signal while injecting the input signal into the injection-locked oscillator at a set of injection points corresponding to an Nth harmonic of the injection-locked oscillator, where N is an integer;
   multiplying a frequency of the oscillator output signal by a factor of N to generate a frequency-multiplied oscillator signal;
   mixing the frequency-multiplied oscillator signal with the input signal to generate a mixed signal;
   filtering the mixed signal; and
   measuring an amplitude of the filtered mixed signal.

2. The method of claim 1, further comprising selecting the value N such that the frequency of the phase-modulated signal is substantially an Nth harmonic of a frequency within a locking range of the injection-locked oscillator.

3. The method of claim 1, further comprising tuning a free-running frequency of the injection-locked oscillator such that the frequency of the phase-modulated signal is substantially an Nth harmonic of the free-running frequency.

4. The method of claim 1, further comprising:
   measuring a phase of the oscillator output signal; and
   providing the measured amplitude of the filtered mixed signal and the measured phase of the oscillator output signal to a CORDIC to estimate in-phase (I) and quadrature (Q) components of the input signal.

5. The method of claim 1, further comprising:
   based on the frequency of the input signal, selecting one of a plurality of band-specific amplifiers; and
   amplifying the input signal with the selected one of the band-specific amplifiers prior to injecting the input signal.

6. The method of claim 1, wherein the oscillator includes at least two phase-shifted output taps, and wherein multiplying the frequency of the oscillator output includes combining signals from the phase-shifted output taps with an XOR gate.

7. The method of claim 1, wherein the injection-locked oscillator is a ring oscillator including a plurality of sequential buffers, wherein frequency-multiplying the oscillator output signal includes combining a first buffer output of a first one of the buffers and a second buffer output of a second one of the buffers with an XOR operation.

8. The method of claim 1, further comprising selecting a value of N based on the frequency of the input signal.

9. The method of claim 1, wherein N is an integer greater than one.

10. An apparatus comprising:
    an injection-locked oscillator having an Nth harmonic input and an oscillator output having multiple phases, the Nth harmonic input being adapted to receive an RF input signal, and the injection-locked oscillator being adapted to generate multiple oscillator output signals having multiple phases at the oscillator output;
    a frequency multiplier having an input and a frequency-multiplied output, the input being connected to the oscillator output, wherein the frequency multiplier is operative to frequency-multiply the input by a factor of N by combining the multiple oscillator output signals having the multiple phases to generate a frequency-multiplied output signal, and wherein the frequency-multiplied output is operative to provide an amplitude-limited replica of the RF input signal;
    a mixer connected to the frequency-multiplied output, the mixer configured to mix the frequency-multiplied output signal with the RF input signal to generate a mixed signal;
    a filter configured to filter the mixed signal; and
    a sampler configured to sample the filtered mixed signal.

11. The apparatus of claim 10, wherein the injection-locked oscillator is a ring oscillator including a plurality of sequential buffers, wherein each buffer of the plurality of sequential buffers has a corresponding phase-shifted output tap of a plurality of output taps configured to generate a corresponding one of the multiple oscillator output signals.

12. The apparatus of claim 11, wherein the frequency multiplier includes an XOR circuit having a first XOR input connected to a first buffer output of a first one of the buffers and a second XOR input connected to a second buffer output of a second one of the buffers.

13. The apparatus of claim 10, wherein the injection-locked oscillator includes a plurality of sets of injection points, each set of injection points corresponding to a different harmonic of the injection-locked oscillator.

14. The apparatus of claim 10, further comprising a controller operative to select the value of N based on the frequency of the input signal;
    wherein the frequency multiplier is connected to the controller and is operative to multiply by the selected value of N.

15. The apparatus of claim 10, further comprising injection selection circuitry connected to a controller, the injection selection circuitry being operative to connect the input signal to a set of injection points corresponding to the Nth harmonic.

16. The apparatus of claim 10, wherein the frequency multiplier is a variable frequency multiplier.

* * * * *